(12) United States Patent
Nuber

(10) Patent No.: US 6,405,358 B1
(45) Date of Patent: Jun. 11, 2002

(54) METHOD FOR ESTIMATING AND DISPLAYING WIRING CONGESTION

(75) Inventor: Paul D Nuber, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/416,015

(22) Filed: Oct. 8, 1999

(51) Int. Cl.[7] .............................................. G06F 17/50
(52) U.S. Cl. ..................................................... 716/12
(58) Field of Search ............................. 716/1, 2, 4, 5, 716/11, 12

(56) References Cited

U.S. PATENT DOCUMENTS 6,067,409 A * 5/2000 Scepanovic ................... 716/8

* cited by examiner

Primary Examiner—Matthew Smith
Assistant Examiner—Thuan Do

(57) ABSTRACT

Routing density estimates within a given integrated circuit are calculated from a proposed floor plan and block interconnect data. The chip is first divided into a number of grid areas, then the routing density is estimated for each grid area. This estimate is calculated by estimating grid areas that signals most likely will cross and summing probabilities. Both horizontal and vertical routing densities are estimated. The estimates for each grid area may then be saved in computer memory, printed, input to a spreadsheet, displayed on the screen, or returned in any other desired format.

32 Claims, 20 Drawing Sheets

METHOD FOR ESTIMATING AND DISPLAYING WIRING CONGESTION

FIELD OF THE INVENTION

This invention relates generally to the design of integrated circuits and in particular to the interconnect routing between blocks of an integrated circuit.

BACKGROUND OF THE INVENTION

When designing integrated circuits, top level floor planning is critical to both the speed and density of the completed circuit. Top level floor planning involves defining the size, shape, and placement location for the modules that are to be interconnected at the top level of the integrated circuit design. Often the location of signal ports for each of the modules must be defined to try to minimize the amount of routing necessary at the top level to connect all the signals. Poor floor planning may lead to signal routes that are much longer than necessary. Also, it is often possible to place the blocks in locations that make routing very difficult, if not impossible. When routing through a portion of the circuit is very difficult, many automated routers will route some signals around the congestion. This greatly lengthens the route of those signals and may significantly degrade their speed.

As integrated circuits shrink in size, routing becomes a larger factor in performance. Each signal trace has an inherent resistance and an inherent capacitance. When a signal driven from one end of a trace transitions from, for example, a high voltage to a low voltage, the received signal at the other end of the trace does not see a sharp edge, but an exponential decay in the signal voltage. This decay may be determined by calculating the time constant ($\tau$) of the circuit formed by the trace resistance and capacitance. The time constant ($\tau$) is the amount of time required for the voltage on the receiving end of the trace to decay by a factor of 1/e, where e is the base of the natural system of logarithms. 1/e is approximately equal to 0.37. This time constant ($\tau$) is calculated by multiplying the trace resistance by the trace capacitance ($\tau=RC$). Thus, these delays due to the trace are commonly called "RC delays". As circuits shrink, these RC delays do not tend to shrink in proportion to transistor area. While the routing may shrink in physical dimensions, the capacitance may increase since the thickness of the dielectric layers is also likely to shrink. This combination may cause the contribution of RC delay to total circuit delay to increase. Therefore, the accurate modeling of RC delays becomes more critical as circuit size shrinks and transistor performance increases. These delays can only be accurately modeled when the routing distance and metal layer are known. This information is needed early in the design process so timing problems may be corrected. Early feedback to the designers of routing delays allows architectural changes before a large part of the design has been completed. This early feedback of possible problems minimizes the amount of re-work needed in the architectural change.

Many integrated circuits use routing channels between blocks to interconnect blocks without having to route over blocks. The area that these channels require is usually directly proportional to the number of signals routed in each channel. For floor planning purposes, it is necessary to fix the minimum area of each routing channel early in the design process.

Currently, many designers must perform a complete route of the integrated circuit to get even minimal routing density and RC delay information. This process is often complicated and time-consuming. Also, in many cases, if the floor plan is inadequate, the route may not complete. This leads to iterations of the floor plan in search of an adequate route.

Thus, there is a need for a method of generating estimated routing densities quickly and easily as early as possible in the design process. There is also a need for a display of these results such that the designer may quickly find the areas of the design that are most likely to have difficulty in routing given a potential floor plan.

SUMMARY OF THE INVENTION

The preferred embodiments of this invention provide a quick visual display of routing density estimates. These estimates are calculated from a proposed floor plan, and block interconnect data. By providing the designer with a fast method for estimating routing density across the integrated circuit, this invention allows very fast iterations of floor plans. These fast iterations allow the designer to choose a good floor plan for a given chip. Representative implementations of this method will typically involve the creation of a computer program to perform all of the numerous calculations required.

This process divides the area of the integrated circuit into a number of grid areas. The estimated vertical and horizontal routing densities are calculated by estimating grid areas that signals most likely will cross and summing probabilities for each of the grid areas. Both vertical and horizontal routing densities are estimated since it is possible to have a route that, in one area, is very dense with lines running vertically while very sparse in lines running horizontally. The converse is also possible, or both horizontal and vertical routing may be very dense in an area. By estimating the probability that a given signal will cross a given area in either the horizontal or vertical direction, these probabilities are summed for all the signals in the design to create and estimated routing density. The estimated routing density results may be displayed graphically on a computer display, printer, or other output device. These results include estimated vertical and horizontal routing densities for each of the areas the design has been divided into. The estimated densities for each of these areas may be displayed graphically, using shapes, shading, or color, or may be simply shown as numeric values.

From the displayed estimated densities, specific areas of the design that are likely to have routing problems during the signal routing phase of the design may be visible. The floor plan may then be modified to reduce these problem areas in an iterative manor until each of the routing problems have been mitigated.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
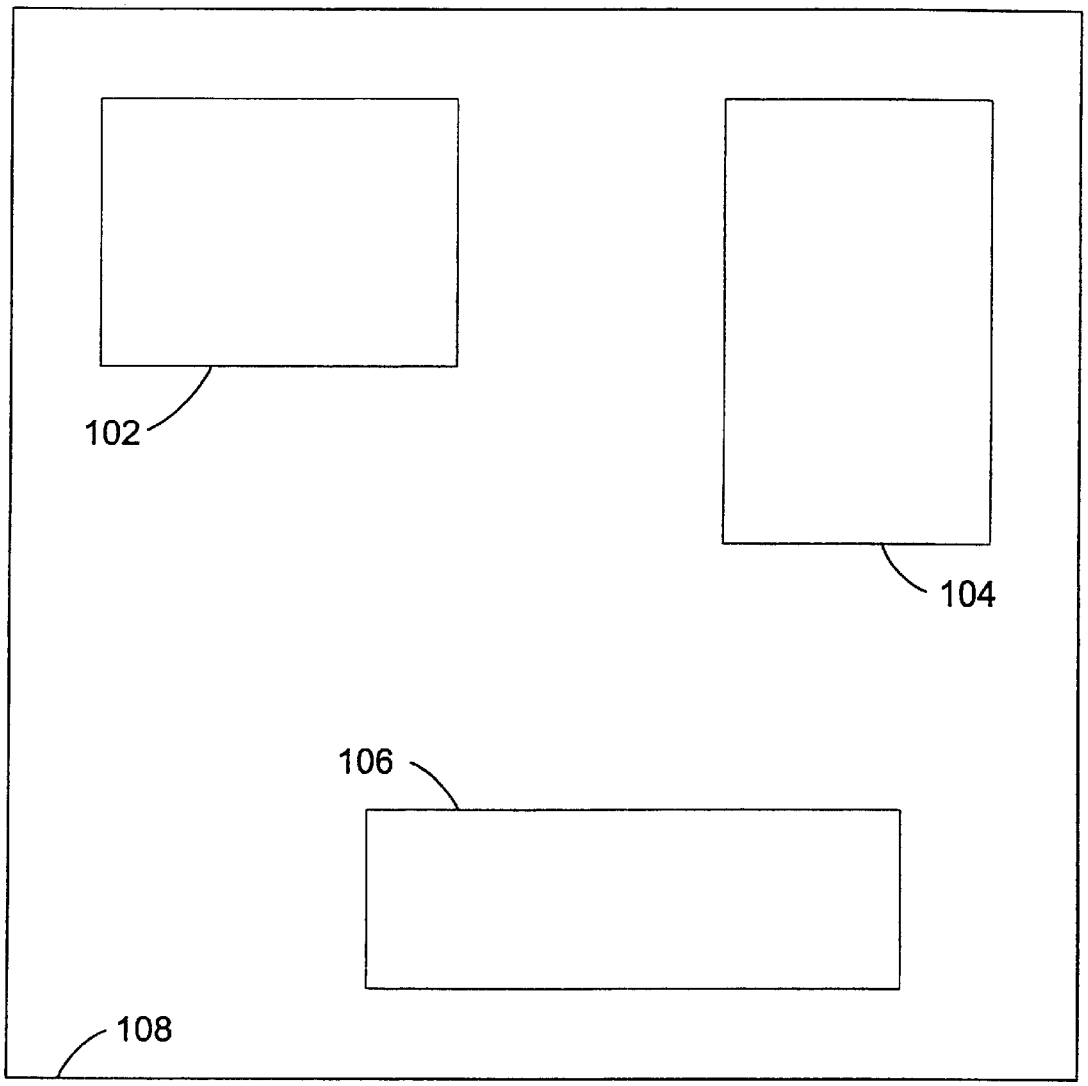
FIG. 1 is a drawing of an integrated circuit floor plan containing three blocks.

The routing congestion estimation process described in this document may be implemented in a program run on a general purpose computer. The program may be stored in random access memory (RAM), read only memory (ROM), flexible disks, hard disks, or other program storage media on a computer. The routing congestion estimation results may be displayed on a cathode ray tube (CRT), printed output, or other display mechanisms on a computer.

The process starts by reading chip dimension data from a file or user input. Chip dimension data will include the x-extent and the y-extent of the chip design. The design is then partitioned into a number of pieces called grid areas. The number of grid areas is user selectable. These grid areas may be very large for a coarse estimate of routing densities or very small when more detail is required. Within each grid area a sum of horizontal routing probability and a sum of vertical routing probability is calculated. These total probabilities represent the estimated horizontal and vertical routing densities of each grid area on the chip. These calculations will be described in detail below.

Next, a list of all the signals on the chip is read. This list is usually obtained from a chip database. For each signal on the chip, the chip database is queried to get a driver and the list of all receivers for the current signal. In cases of signals with more than one driver, any of several methods may be used to evaluate the signal. For example, one driver may be chosen to act as 'the' driver, and the other drivers may be treated as receivers for the purposes of this estimation. Each receiver is individually examined to find the likely routing area from the driver to the current receiver. Since the chip database contains size and location details for each block on the chip, the likely routing area may be estimated from the location and size of the driver and each receiver. Once the (x,y) location and the extent of the driver and the current receiver are known, a probability rectangle is created using the center of the driver and the center of the current receiver as the corners of this probability rectangle. This rectangle represents the area of the chip where the connection between the driver and the current receiver will most likely be routed. Next a list of all grid areas that the current probability rectangle covers, either partially or fully, is compiled. Note that in this example the probability rectangle is drawn from the centers of the blocks, but other implementations may draw the probability rectangle from other areas within the blocks.

Once this list of all grid areas is built, each of the grid areas is examined in turn. For each grid area that the probability rectangle covers, a number of calculations are performed to estimate the routing density within each grid area. When a probability rectangle only covers part of a grid area, the routing density is calculated as a portion of the unit density used when a probability rectangle completely covers a grid area.

To calculate the vertical signal probability of the current probability rectangle in the current grid area, the horizontal overlap of the probability rectangle and the current grid area is computed. This horizontal overlap is divided by the rectangle width to produce the local vertical probability. It may be seen that for a probability rectangle that does not completely horizontally traverse the grid area, the local vertical probability will be less than one. Note that whether or not the probability rectangle completely vertically traverses the grid area is not used in calculating the local vertical probability. This local vertical probability is added to the sum of vertical signal probability for the current grid area.

Next the local horizontal signal probability is calculated in a method similar to the calculation of the local vertical probability. The vertical overlap of the current probability rectangle and the current grid area is calculated. This vertical overlap is then divided by the height of the current grid area to produce the local horizontal probability. This local horizontal signal probability is added to the total horizontal probability for the current grid area.

If the signal has a fanout greater than one, the branches are evaluated individually and then all the branch probabilities are summed together. The sum in any one grid area is limited to not be greater than one for any single signal.

These calculations are repeated for each grid area covered by the current probability rectangle. Then the list of receivers is checked to see if all the receivers for the current signal have been processed. If so, the signal list is checked to see if these iterations have been completed for every signal on the chip. If so, all of the vertical and horizontal probabilities for each grid area on the chip have been calculated and the data may be displayed.

The routing density estimate data is displayed in a form that is easily understood by the user. Many embodiments of this invention will display the routing density estimates to the computer screen. First the chip outline is drawn, then the density data for each grid area of the chip is displayed within the chip outline. One embodiment of this invention uses colored (or shaded) bars to represent the densities. Each grid area contains a horizontal colored (or shaded) bar to represent the horizontal routing density and a vertical colored (or shaded) bar to represent the vertical routing density. Other embodiments may use bars of different size or shape to represent the routing densities. Still other embodiments may not use graphical data at all, but print a chart or table. The data may be sent directly to a spreadsheet or other processing software. The order of program flow described in this description is one embodiment of the invention. Other program flows comprising similar steps may function equally well.

FIG. 1 through FIG. 9 help illustrate the process used in one embodiment of this invention on a small example integrated circuit floor plan. FIG. 1 is a drawing of this example integrated circuit floor plan where element 102 is a first block, element 104 is a second block, and element 106 is a third block. The chip outline 108 shows the size of the overall integrated circuit.

Figure 2:
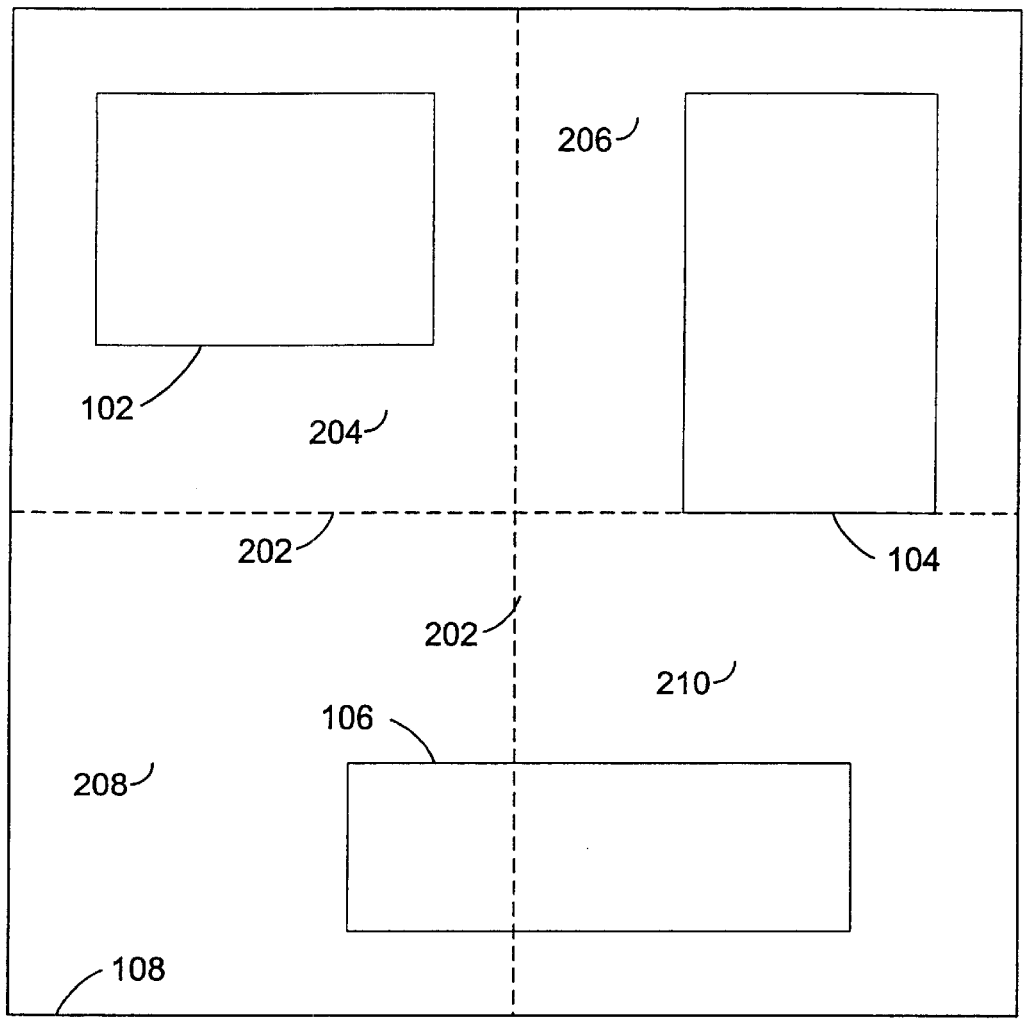
FIG. 2 is a drawing of the integrated circuit floor plan from FIG. 1 divided into a 2 by 2 grid.

FIG. 2 is a drawing of the same integrated circuit floor plan from FIG. 1 with a 2×2 grid 202 drawn over the floor plan. This grid creates four grid areas within the floor plan. The first block 102 is completely enclosed within the upper left grid area 204. The second block 104 is completely enclosed within the upper right grid area 206. The third block 106 spans the lower left grid area 208 and lower right grid area 210.

Figure 3:
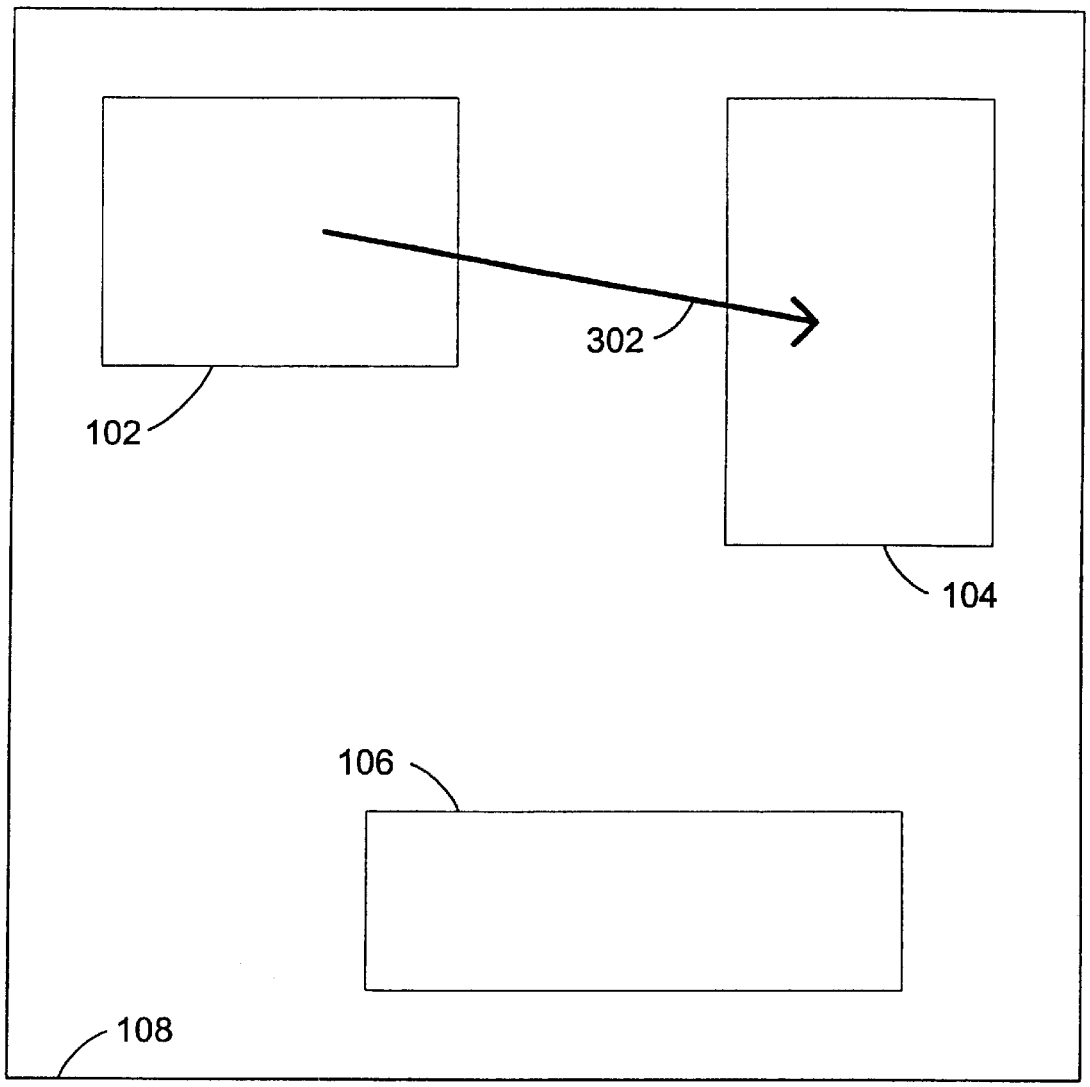
FIG. 3 is a drawing of the integrated circuit floor plan from FIG. 1 showing a signal connecting two blocks.

FIG. 3 is a drawing of the same integrated circuit floor plan from FIG. 1 with an arrow representing a signal 302 interconnecting the first block 102 and the second block 104.

Figure 4:
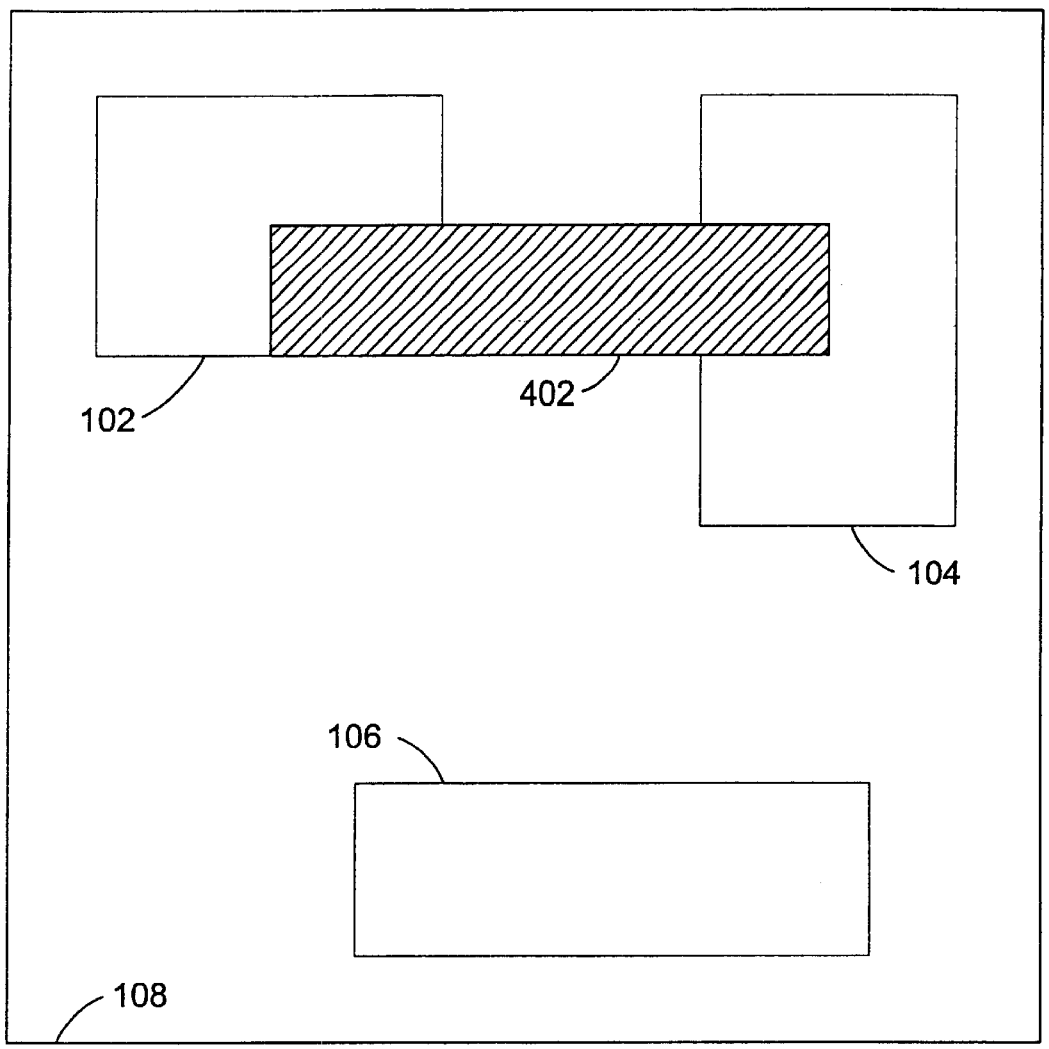
FIG. 4 is a drawing of the integrated circuit floor plan from FIG. 1 showing the probability rectangle for the signal from FIG. 3.

FIG. 4 is a drawing of the same integrated circuit floor plan from FIG. 3 with a probability rectangle 402 of the signal 302 shown interconnecting block 102 and block 104. This probability rectangle is drawn from the center of the first block 102 (the upper left corner of the probability rectangle) to the center of the second block 104 (the lower right corner of the probability rectangle) but in other embodiments may be drawn from other locations within, or near, the blocks.

Figure 5:
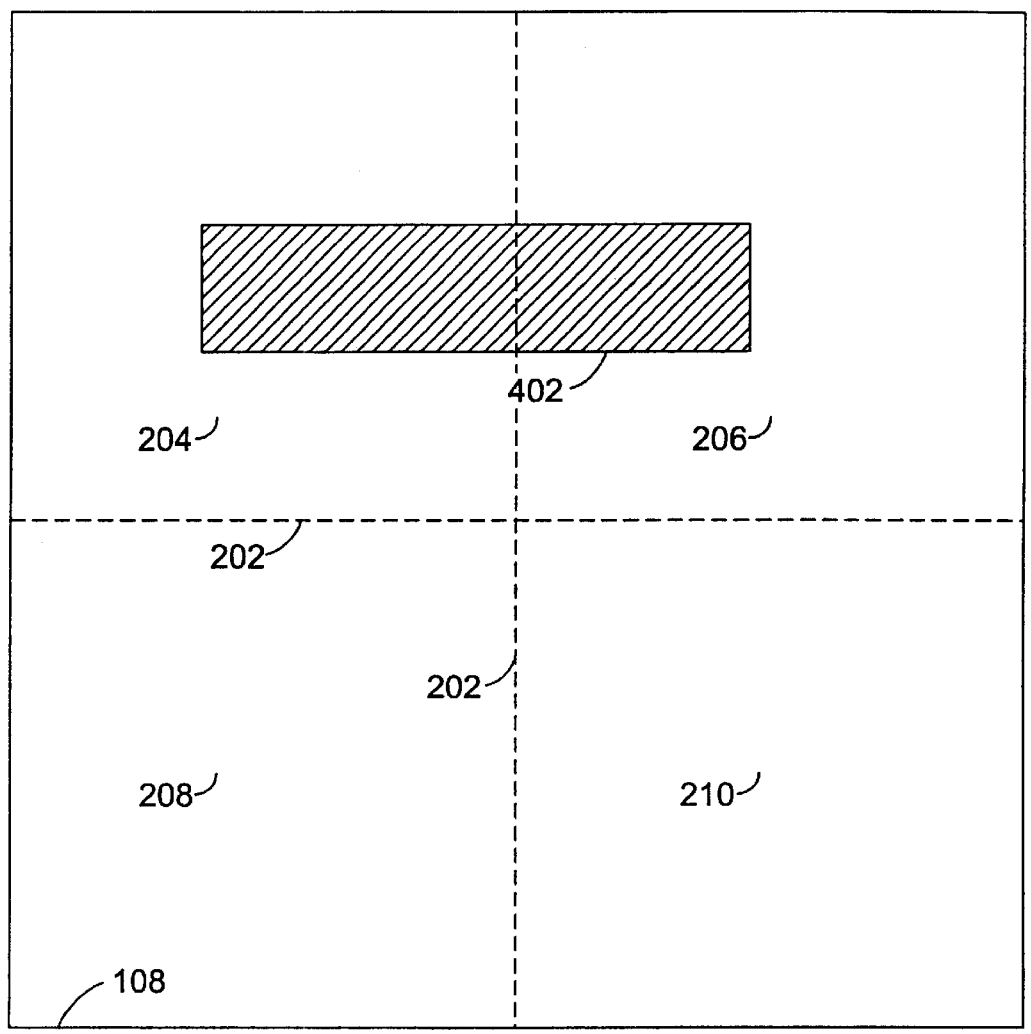
FIG. 5 is a drawing of the probability rectangle from FIG. 4 within the 2 by 2 grid from FIG. 2.

FIG. 5 is a drawing of the same probability rectangle 402 from FIG. 4 with the grid 202 from FIG. 2 on the chip outline 108 from FIG. 1. This probability rectangle spans the upper left grid area 204 and upper right grid area 206. The probability rectangle does not cross the lower left grid area 208 or the lower right grid area 210.

Figure 6:
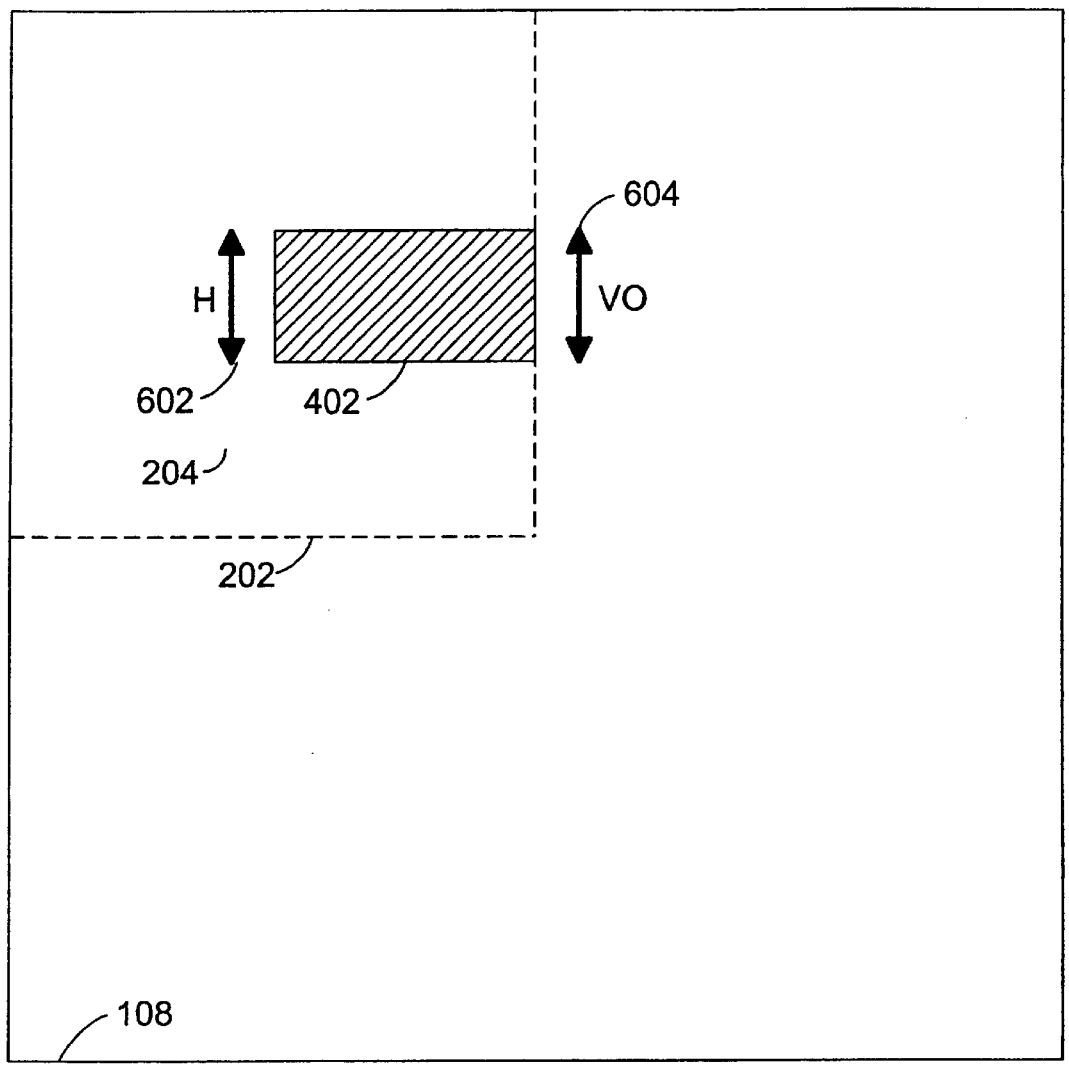
FIG. 6 is a drawing of the probability rectangle from FIG. 5 as used to calculate the vertical routing density for the upper left grid area.

FIG. 6 is a drawing of the same probability rectangle 402 from FIG. 5 with the parameters necessary for calculation of the horizontal probability of the upper left grid area 204 shown. Parameter H 602 is the height of the probability rectangle. Parameter VO 604 is the vertical overlap of the probability rectangle. The horizontal probability is calculated by dividing the vertical overlap, VO 604, by the rectangle height, H 602. In this example, the vertical overlap, VO 604, equals the height, H 602, of the probability rectangle, so the horizontal probability is equal to 1.

Figure 7:
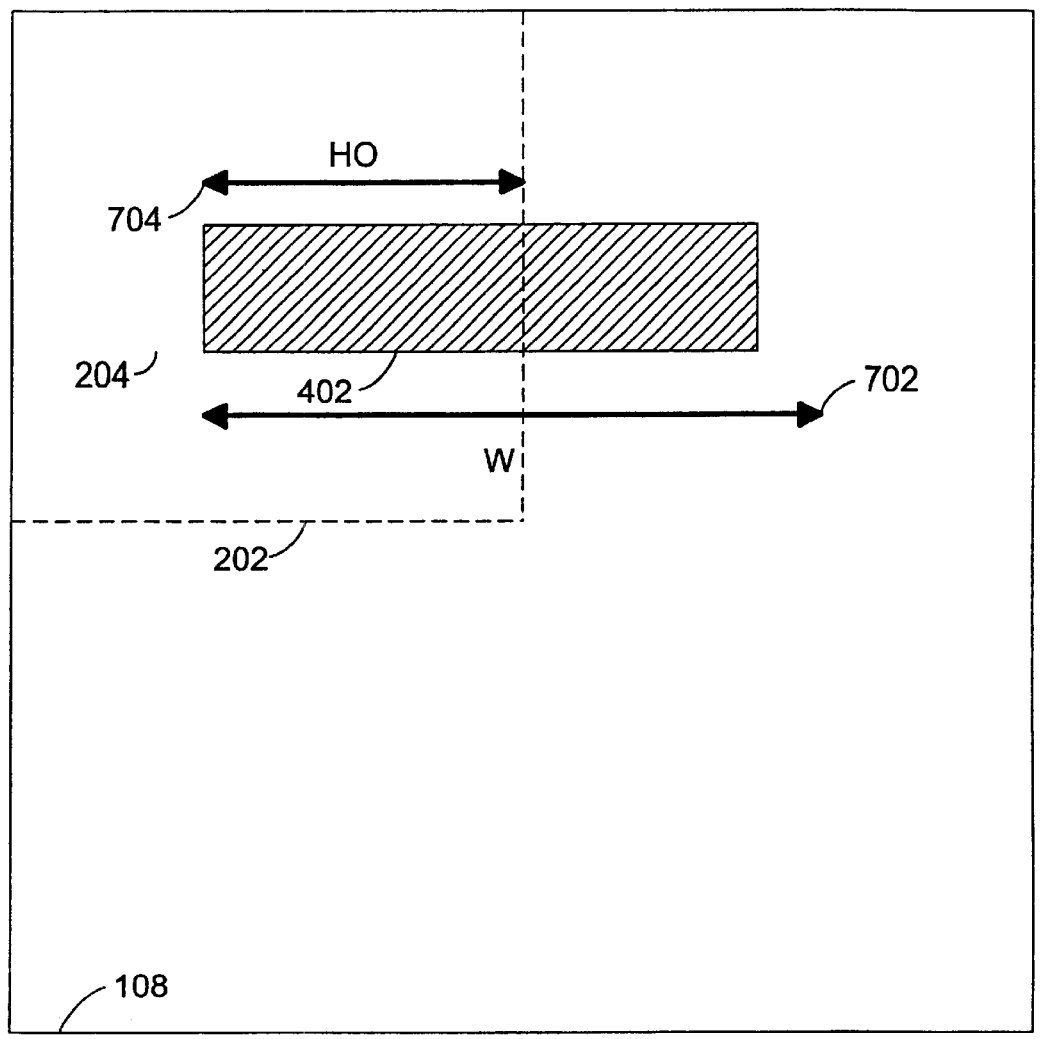
FIG. 7 is a drawing of the probability rectangle from FIG. 5 as used to calculate the horizontal routing density for the upper left grid area.

FIG. 7 is a drawing of the same probability rectangle 402 from FIG. 5 with the parameters necessary for calculation of the vertical probability of the upper left grid area 204 shown. Parameter W 702 is the width of the probability rectangle 402. Parameter HO 704 is the horizontal overlap of the probability rectangle 402. The vertical probability is calculated by dividing the horizontal overlap, HO 704, by the width, W 702. For the present example, the horizontal overlap, HO 704, is equal to 0.6 W, so the vertical probability is equal to 0.6.

Figure 8:
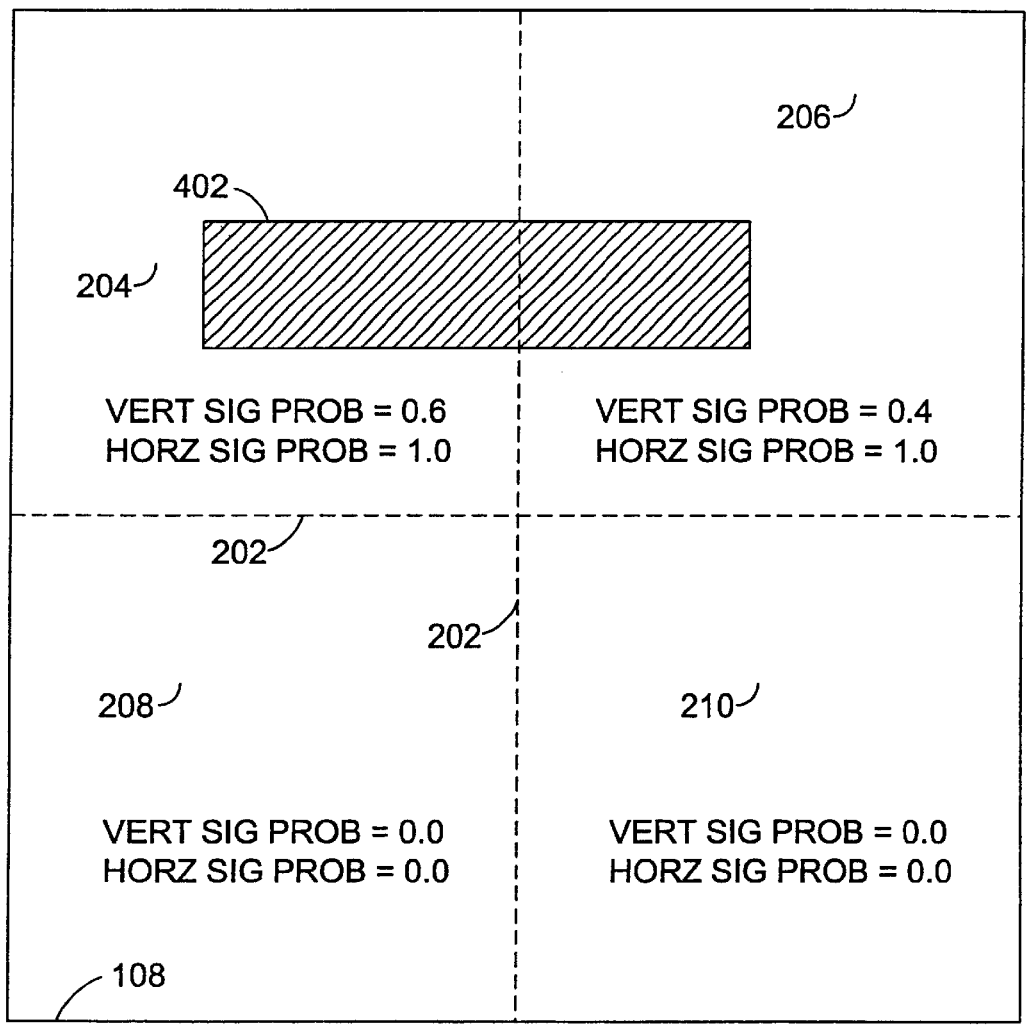
FIG. 8 is a drawing of the probability rectangle from FIG. 5 with all the signal routing densities shown for all four grid areas.

FIG. 8 is a drawing of the vertical and horizontal signal probabilities calculated for the probability rectangle 402 from FIG. 5 in all four of the grid areas. The horizontal signal probability of 1.0 for the upper left grid area 204 was calculated using the parameters illustrated in FIG. 6. The vertical signal probability of 0.6 for the upper left grid 204 area was calculated using the parameters illustrated in FIG. 7. The horizontal and vertical signal probabilities for the upper right grid area 206 were calculated in a similar way. Since the probability rectangle did not cross the lower left 208 or lower right 210 grid areas, the signal probabilities in these areas are 0.

Figure 9:
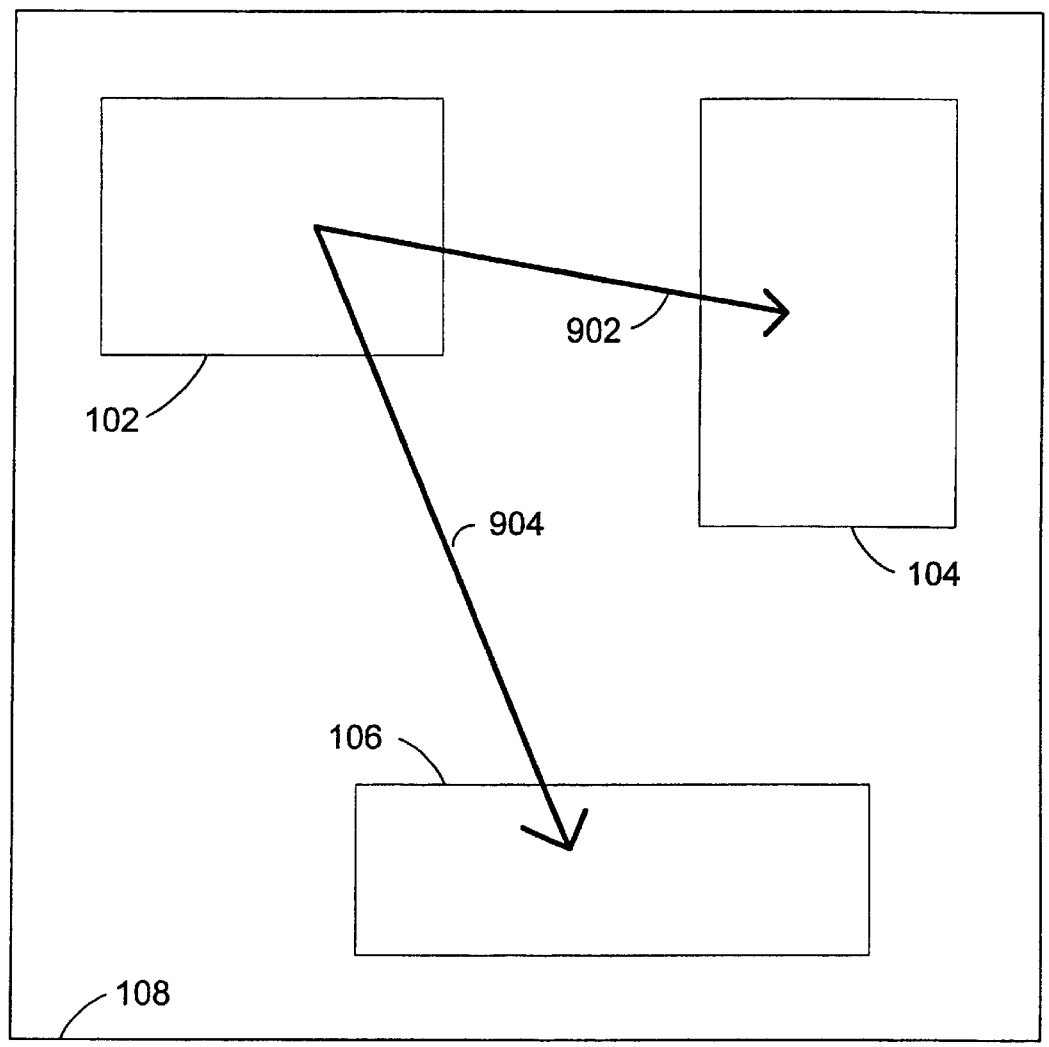
FIG. 9 is a drawing of the integrated circuit floor plan from FIG. 1 showing a signal driven from one block to two other blocks.

FIG. 9 is a drawing of the integrated circuit floor plan from FIG. 1 with two arrows representing a signal driven from the first block 102 to the other blocks 104 and 106. The first branch 902 of the signal is driven from block 102 to block 104. The second branch 904 of the signal is driven from block 102 to block 106.

Figure 10:
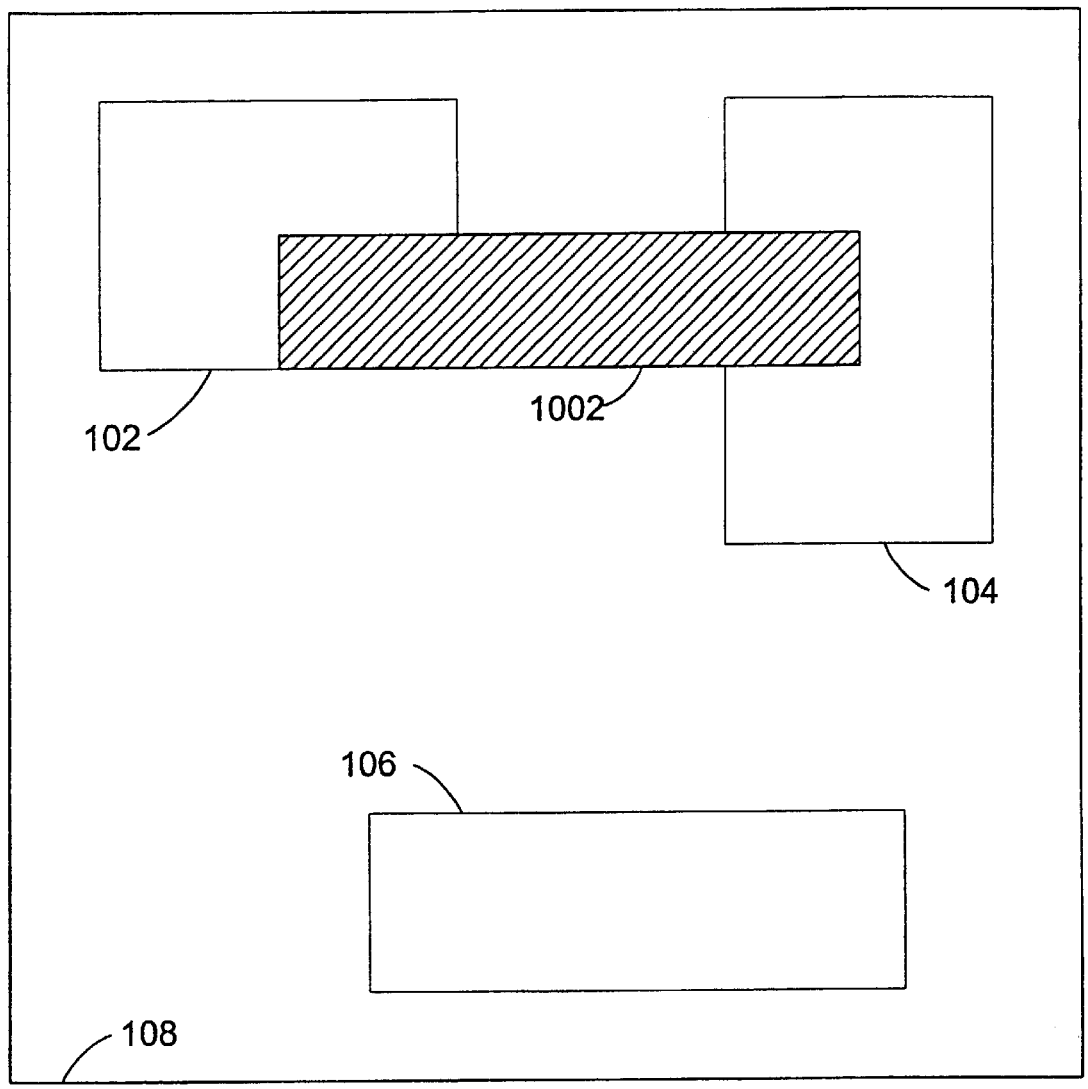
FIG. 10 is a drawing of the probability rectangle for the first branch of the signal from FIG. 9.

FIG. 10 is a drawing of the same integrated circuit floor plan and signal from FIG. 9 with a probability rectangle 1002 of the branch 902 from FIG. 9 shown interconnecting block 102 and block 104. This probability rectangle is drawn from the center of the first block 102 (the upper left corner of the probability rectangle) to the center of the second block 104 (the lower right corner of the probability rectangle) but in other embodiments may be drawn from other locations within, or near, the blocks.

Figure 11:
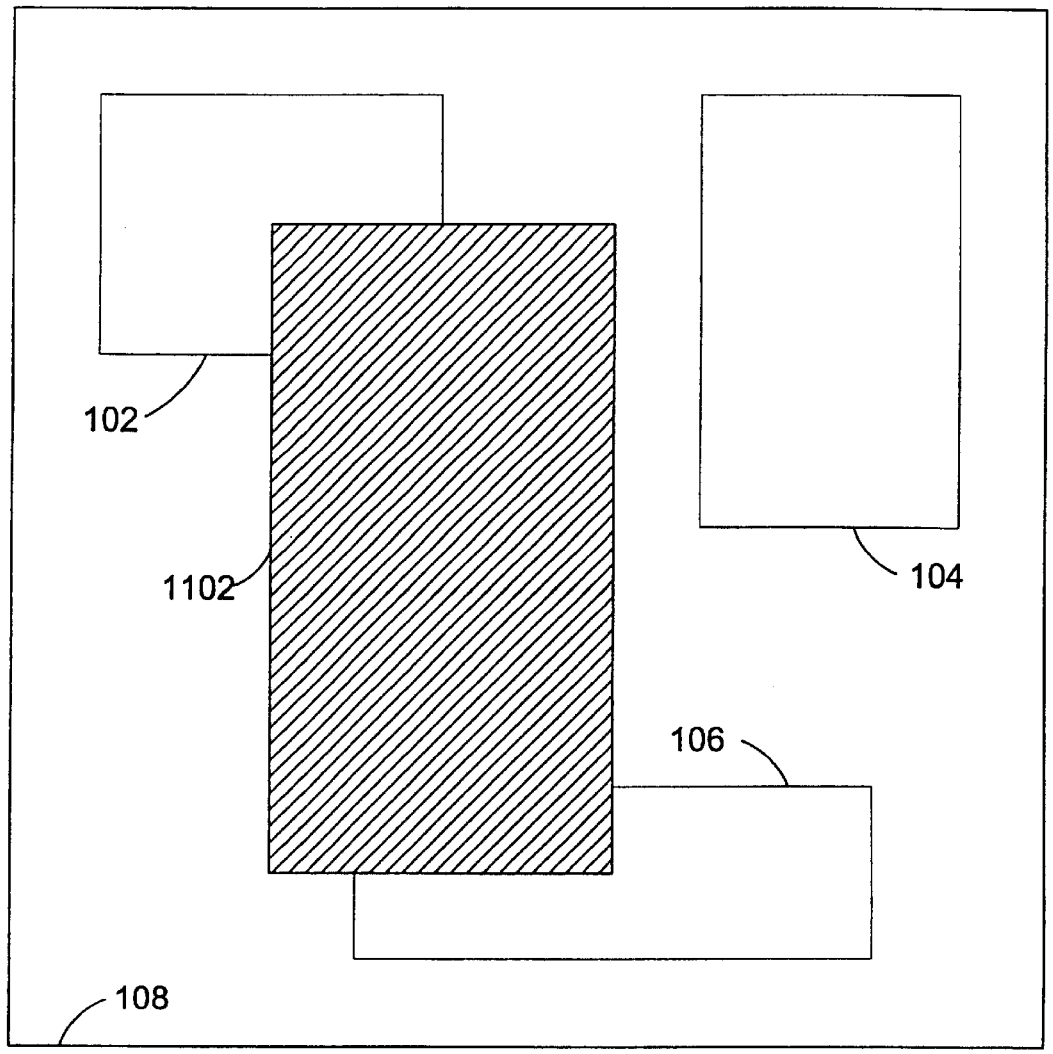
FIG. 11 is a drawing of the probability rectangle for the second branch of the signal from FIG. 9.

FIG. 11 is a drawing of the same integrated circuit floor plan and signal from FIG. 9 with a probability rectangle 1102 of the branch 904 from FIG. 9 shown interconnecting block 102.and block 106. This probability rectangle is drawn from the center of the first block 102 (the upper left corner of the probability rectangle) to the center of the second block 106 (the lower right corner of the probability rectangle) but in other embodiments may be drawn from other locations within, or near, the blocks.

Figure 12:
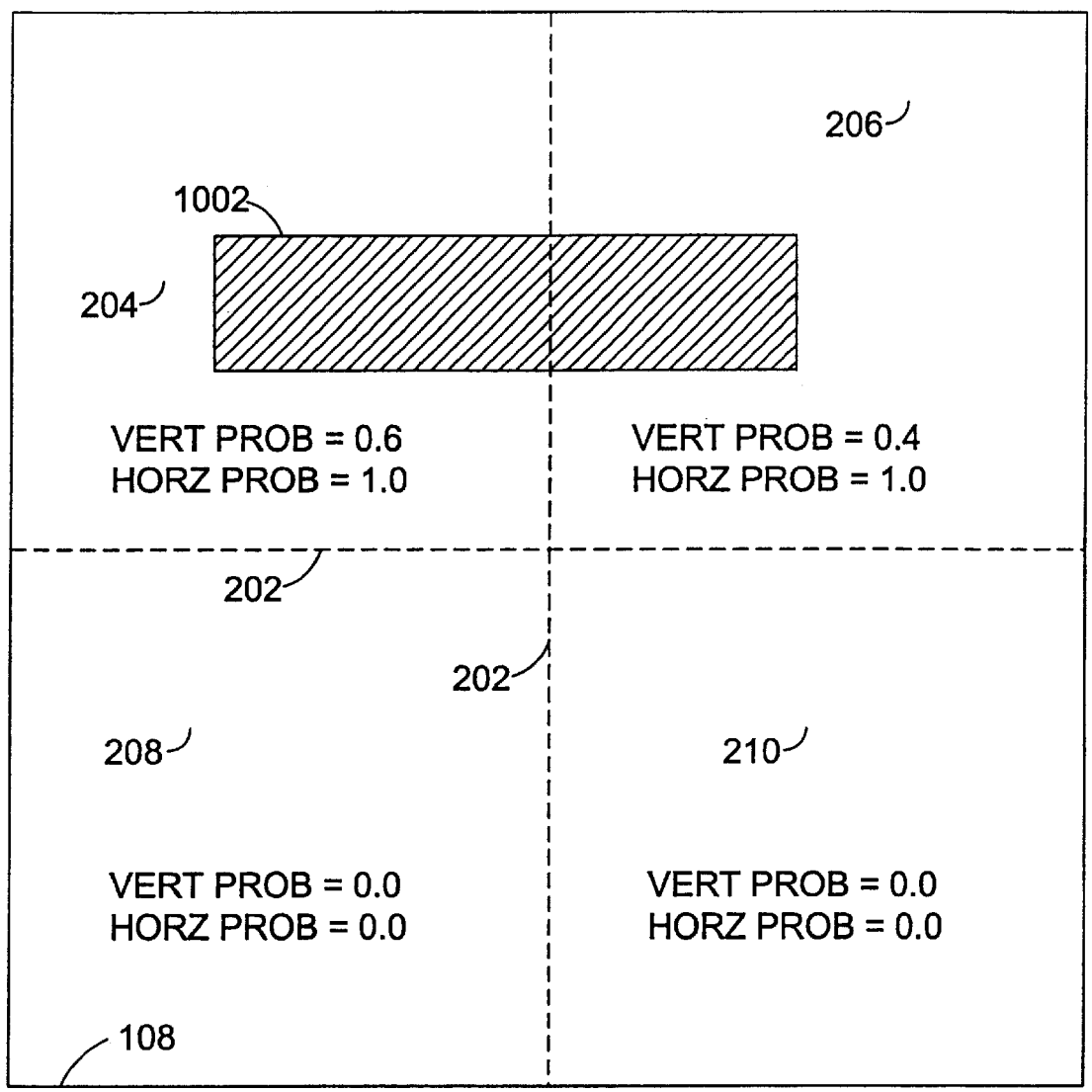
FIG. 12 is a drawing of the probability rectangle from FIG. 10 with all the branch routing densities shown for all four grid areas.

FIG. 12 is a drawing of the same probability rectangle 1002 from FIG. 10 with the grid 202 from FIG. 2 on the chip outline 108 from FIG. 1. This probability rectangle spans the upper left grid area 204 and upper right grid area 206. The probability rectangle does not cross the lower left grid area 208 or the lower right grid area 210. The branch horizontal and vertical probabilities are shown in each of the grid areas calculated from the probability rectangle 1002. In the upper left grid area 204 the vertical probability is 0.6 and the horizontal probability is 1.0. In the upper right grid area 206 the vertical probability is 0.4 and the horizontal probability is 1.0. In the lower left grid area 208 the vertical and horizontal probabilities are 0.0 since the probability rectangle 1002 does not enter the lower left grid area 208. In the lower right grid area 210 the vertical and horizontal probabilities are 0.0 since the probability rectangle 1002 does not enter the lower right grid area 210.

Figure 13:
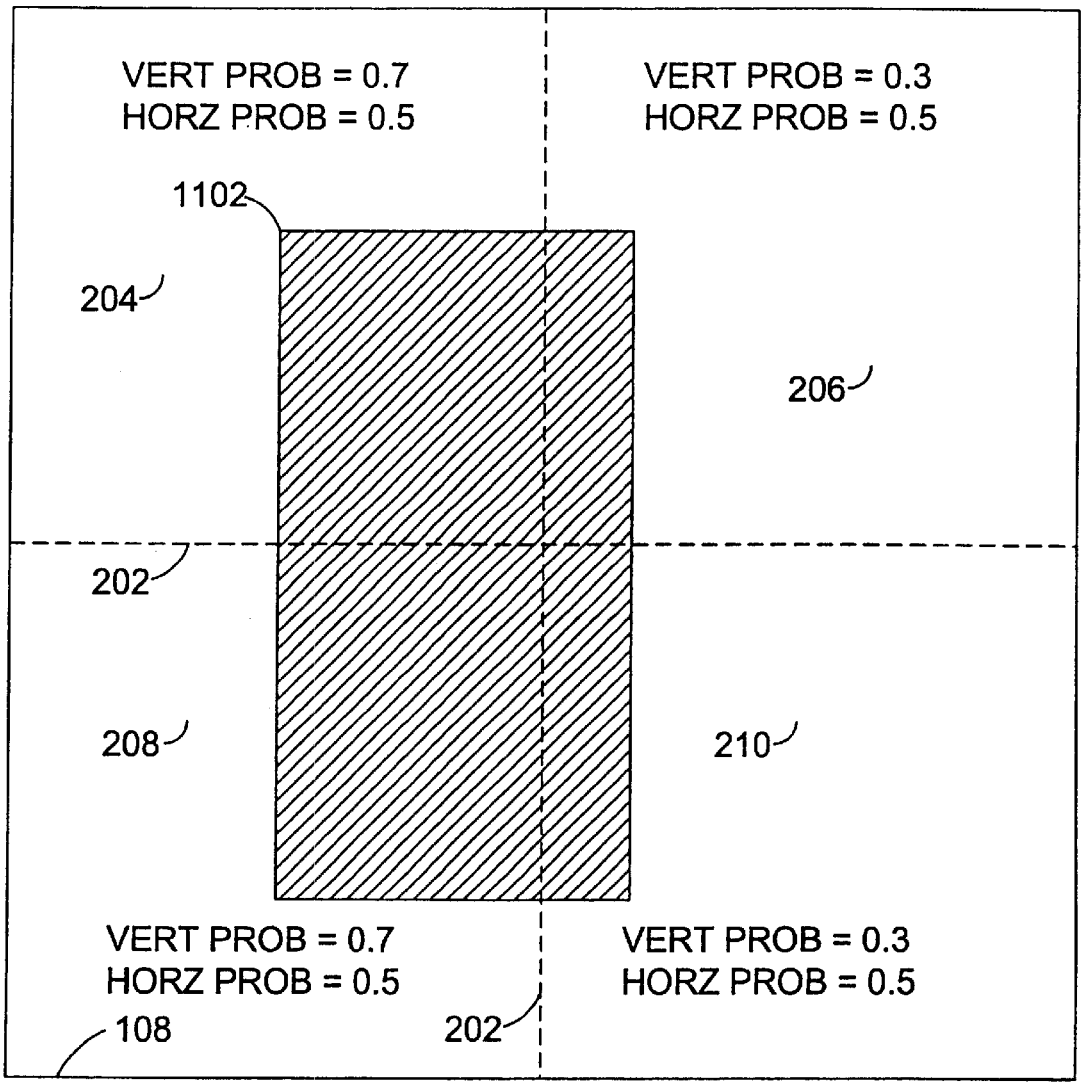
FIG. 13 is a drawing of the probability rectangle from FIG. 11 with all the branch routing densities shown for all four grid areas.

FIG. 13 is a drawing of the same probability rectangle 1102 from FIG. 11 with the grid 202 from FIG. 2 on the chip outline 108 from FIG. 1. This probability rectangle spans all four grid areas 204, 206, 208, and 210. The branch horizontal and vertical probabilities are shown in each of the grid areas calculated from the probability rectangle 1102. In the upper left grid area 204 the vertical probability is 0.7 and the horizontal probability is 0.5. In the upper right grid area 206 the vertical probability is 0.3 and the horizontal probability is 0.5. In the lower left grid area 208 the vertical probability is 0.7 and the horizontal probability is 0.5. In the lower right grid area 210 the vertical probability is 0.3 and the horizontal probability is 0.5.

Figure 14:
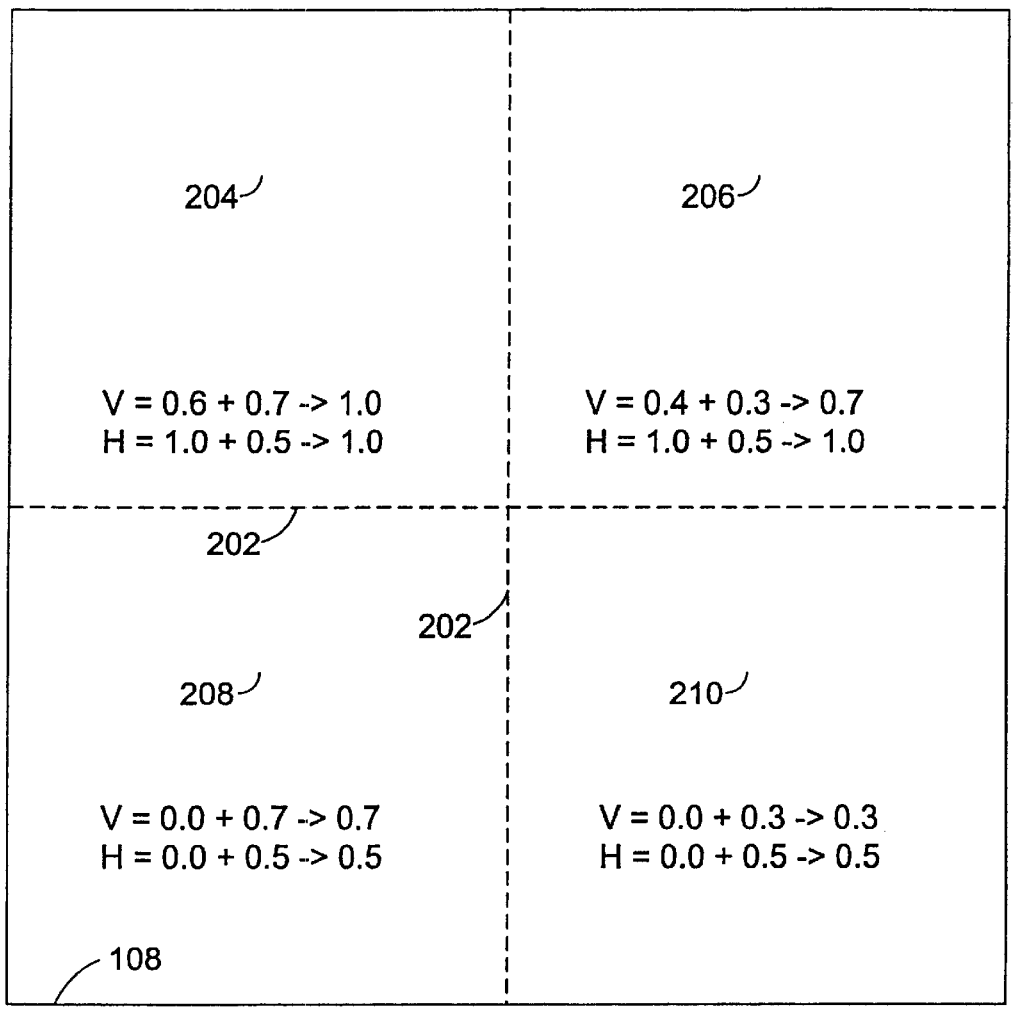
FIG. 14 is a drawing showing the calculation of the signal probabilities for the signal from FIG. 9 for each of the four grid areas.

FIG. 14 is a drawing of the calculation of the vertical and horizontal signal probabilities for the signal with two branches shown in FIG. 9 through FIG. 13. In the upper left grid area 204 the vertical signal probability is calculated by adding the vertical branch probabilities from FIG. 12 and FIG. 13 of 0.6 and 0.7 respectively. This sum of 1.3 is reduced to 1.0 to keep the vertical probability for any given signal to 1.0 or lower. Likewise, the horizontal signal probability for the upper left grid area 204 is calculated by adding the horizontal branch probabilities from FIG. 12 and FIG. 13 of 1.0 and 0.5 respectively. This sum of 1.5 is reduced to 1.0 to keep the horizontal probability for any given signal to 1.0 or lower. In similar fashion, the vertical and horizontal signal probabilities of 0.7 and 1.0 respectively are calculated for the upper right grid area 206. Also, the vertical and horizontal signal probabilities of 0.7 and 0.5 are calculated for the lower left grid area 208. Also, the vertical and horizontal signal probabilities of 0.3 and 0.5 are calculated for the lower right grid area 210.

Figure 15:
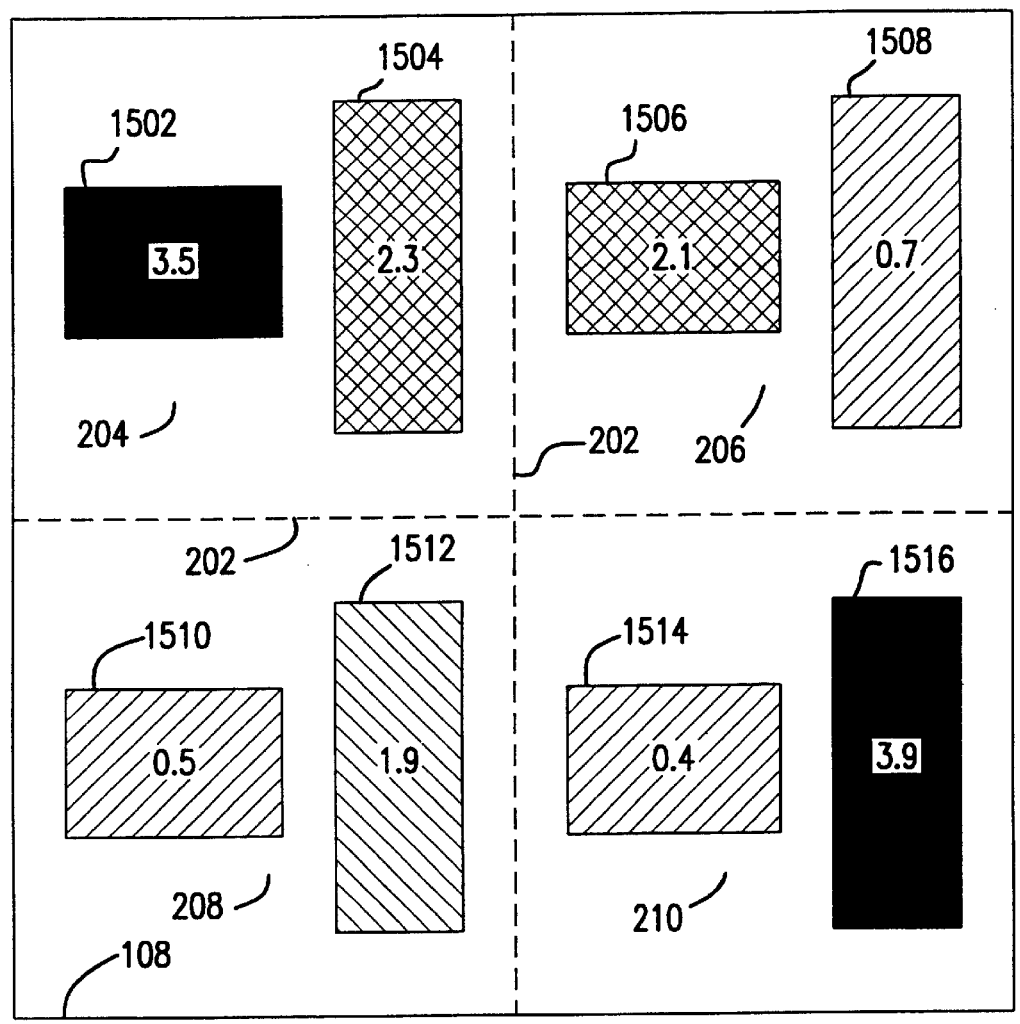
FIG. 15 is a drawing of a sample output display for an integrated circuit floor plan from FIG. 1.

FIG. 15 is a drawing of the display output of one embodiment of this invention using the floor plan and grid from FIG. 2. Note that FIG. 15 shows the output of the process after many signals have been examined in a method similar to that shown in FIG. 1 through FIG. 14. FIG. 1 through FIG. 8 detail the calculations made for one signal between one driver and one receiver. FIG. 9 through FIG. 14 detail the calculations made for one signal between one driver and two receivers. This process is followed for all of the signal connections in the design to create the final output display represented by FIG. 15. In FIG. 15, a number of signals interconnect the three blocks. The chip outline 108 is divided into a 2×2 grid 202. The total horizontal and vertical routing probabilities are then calculated for each of the four grid areas 204, 206, 208, and 210. Within each grid area, a horizontal rectangle is drawn representing the horizontal routing density, and a vertical rectangle is drawn representing the vertical routing density. The rectangles are shaded (or colored) according to the sum of their probabilities (estimated routing densities). In this example, four different shades are used to represent the estimated routing densities. In the upper left grid area 204 the estimated horizontal routing density 1502 is 3.5 and the estimated vertical routing density 1504 is 2.3. In the upper right grid area 206 the estimated horizontal routing density 1506 is 2.1 and the estimated vertical routing density 1508 is 0.7. In the lower left grid area 208 the estimated horizontal routing density 1510 is 0.5 and the estimated vertical routing density 1512 is 1.9. In the lower right grid area 210 the estimated horizontal routing density 1514 is 0.4 and the estimated vertical routing density 1516 is 3.9. All of these density rectangles are drawn on the screen within a representation of the chip outline 108 divided by the grid 202.

Figure 16:
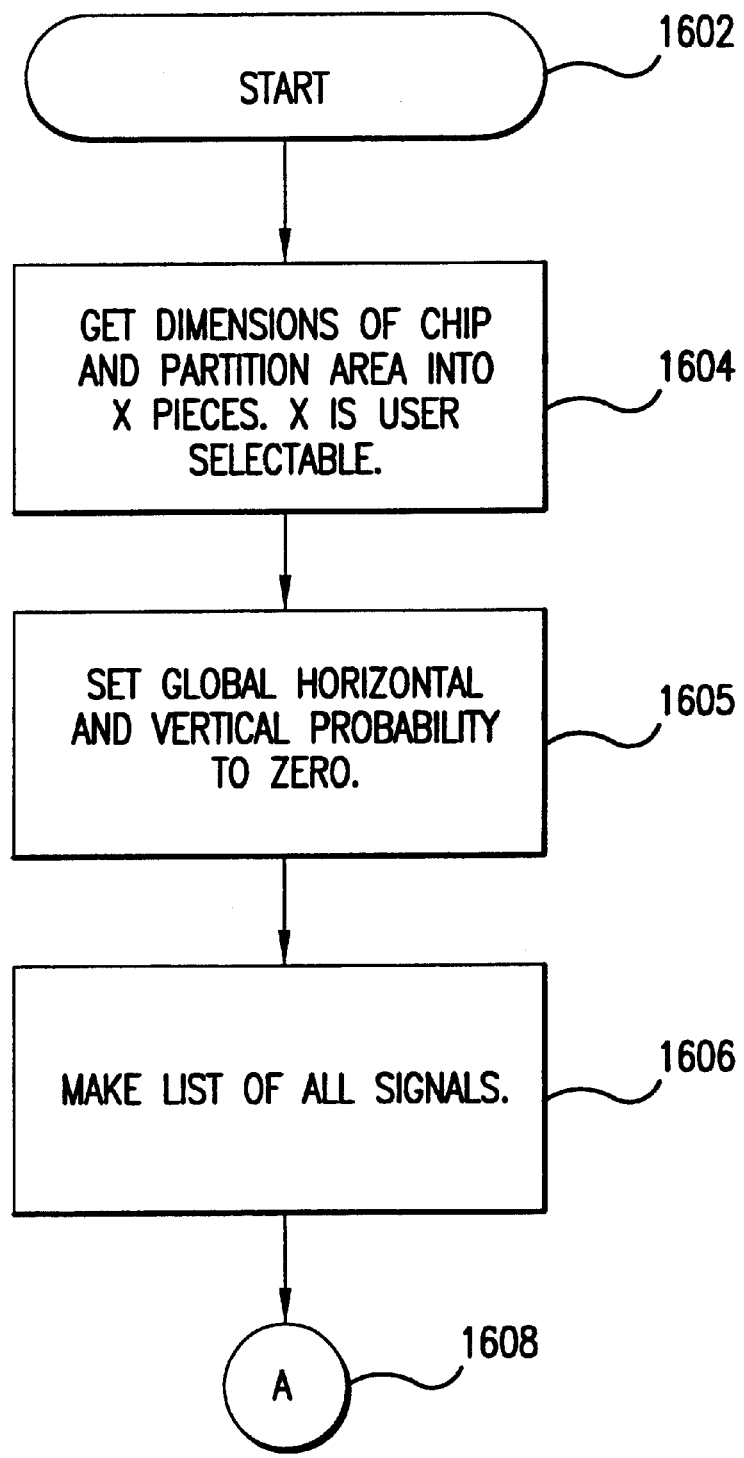
FIG. 16 is a software flowchart for a representative embodiment of this invention.

One embodiment of this invention is shown in the flowcharts shown in FIG. 16 through FIG. 20. FIG. 16 is a flowchart showing the process starting at the node labeled Start 1602. In a step 1604 the program gets the dimensions of the chip and partitions the area into a number of equal pieces. (In other embodiments, the partitions need not be of equal size.) The user specifies the number of partitions, as the number of rows and columns desired. In a step 1605 the probability counters are reset to zero. In a step 1606 the program makes a list of all the signals to be routed in the design. This may be accomplished through a user created input file, reading a circuit database, or manually entered. The program moves on to a decision step 1702, through connector A 1608 continued in FIG. 17.

Figure 17:
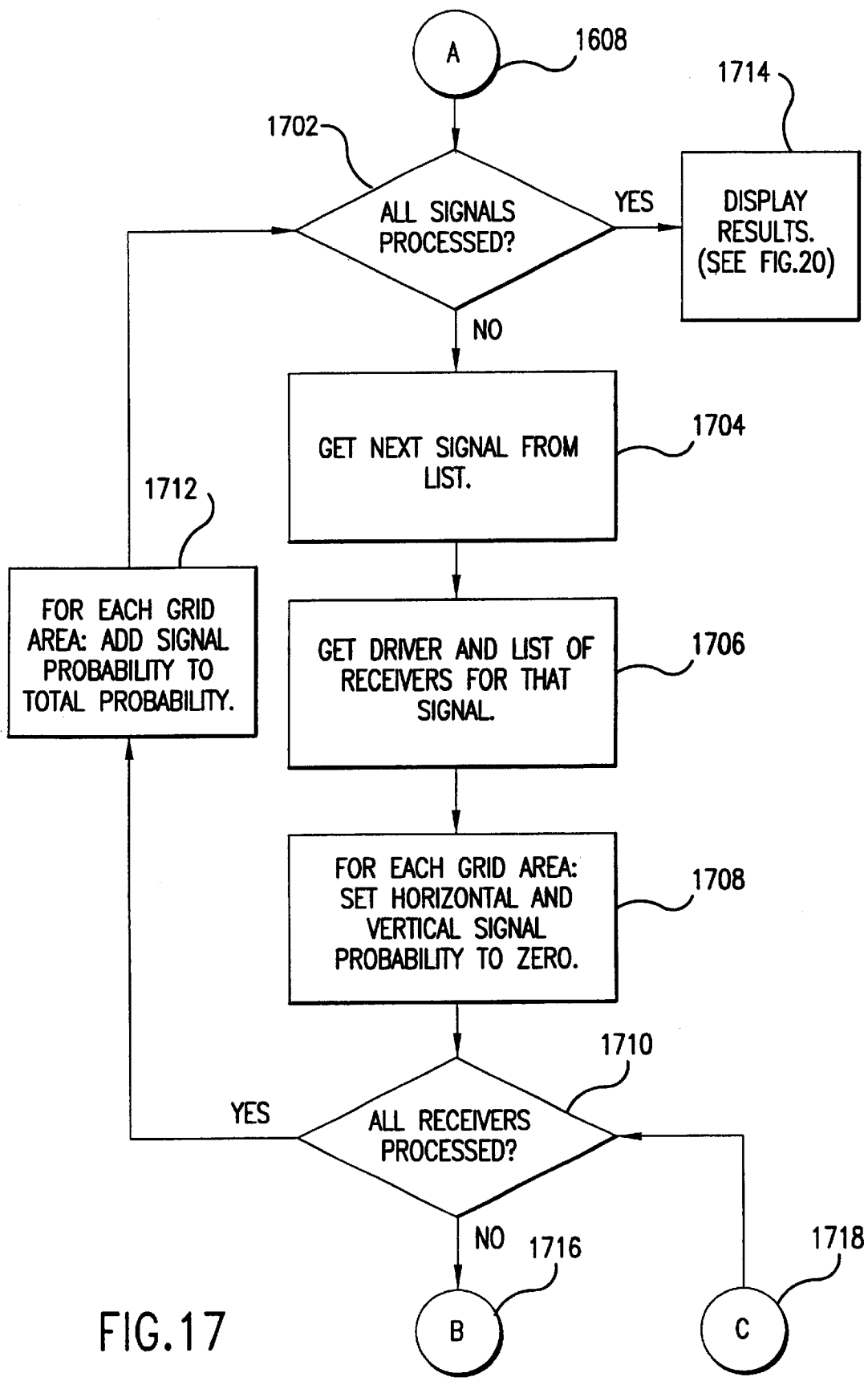
FIG. 17 is a continuation of the software flowchart from FIG. 16.
Figure 20:
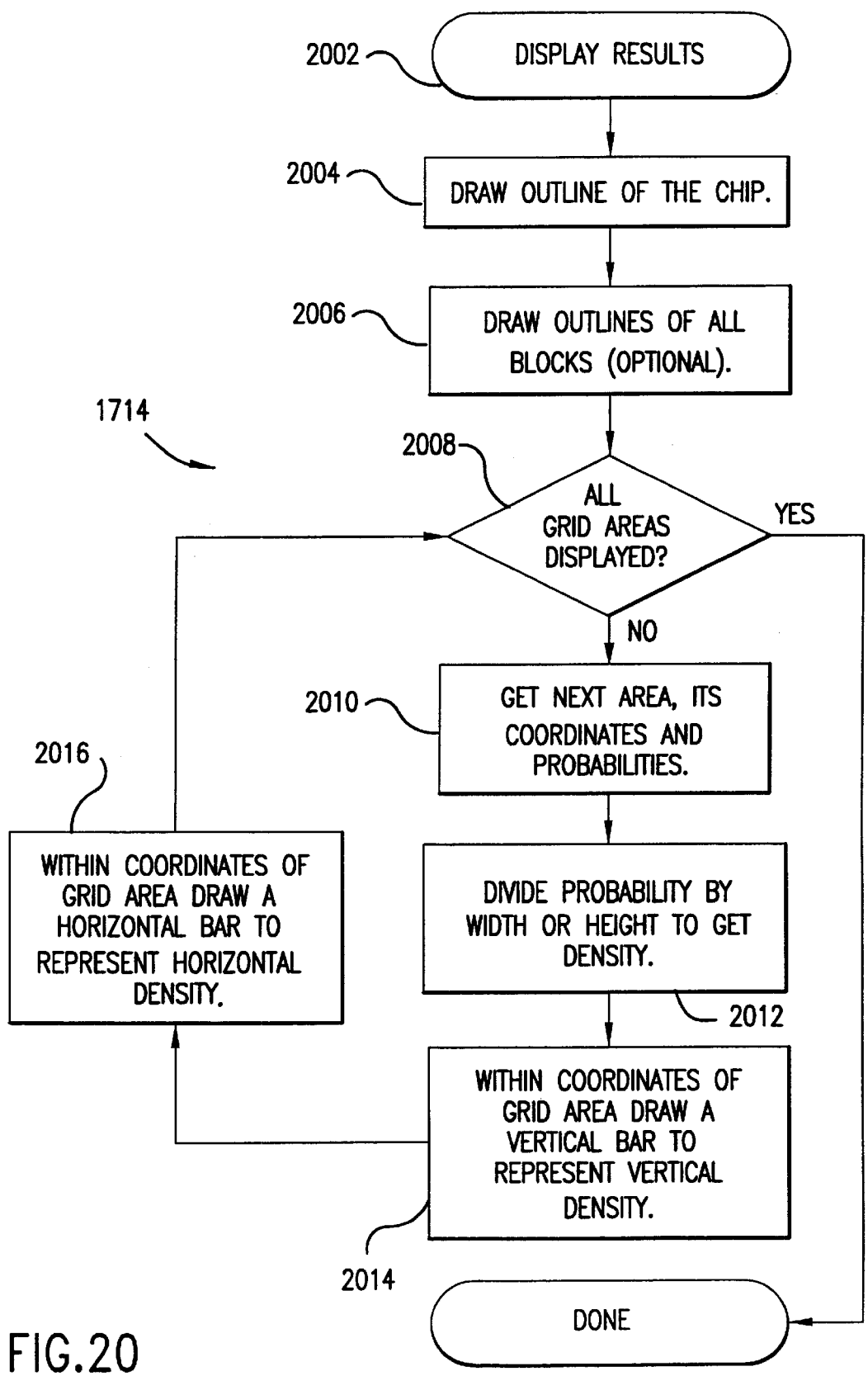
FIG. 20 is a software flowchart for a representative embodiment of the results display process of this invention.

In FIG. 17 a decision step 1702 is executed. If all the signals have been processed, the program branches to display the routing density estimation results in a step 1714. The display routines in step 1714 are shown in FIG. 20 and will be described in detail below. If there is a signal to be processed, the program retrieves the data for the next signal on the list as shown in step 1704. This data includes all the blocks the signal connects to. In a step 1706 the program determines the driving block and all receiving blocks for the signal. In a step 1708 the horizontal and vertical signal probabilities for each grid area are initialized to zero. At the decision step 1710, if all the receivers for the signal have been processed, the program branches to step 1712 and for each grid area, adds the signal probability to the total probability and returns to decision step 1702. If there are receivers for the current signal that still need to be processed, the program moves on to step 1802, through connector B 1716 continued in FIG. 18.

Figure 18:
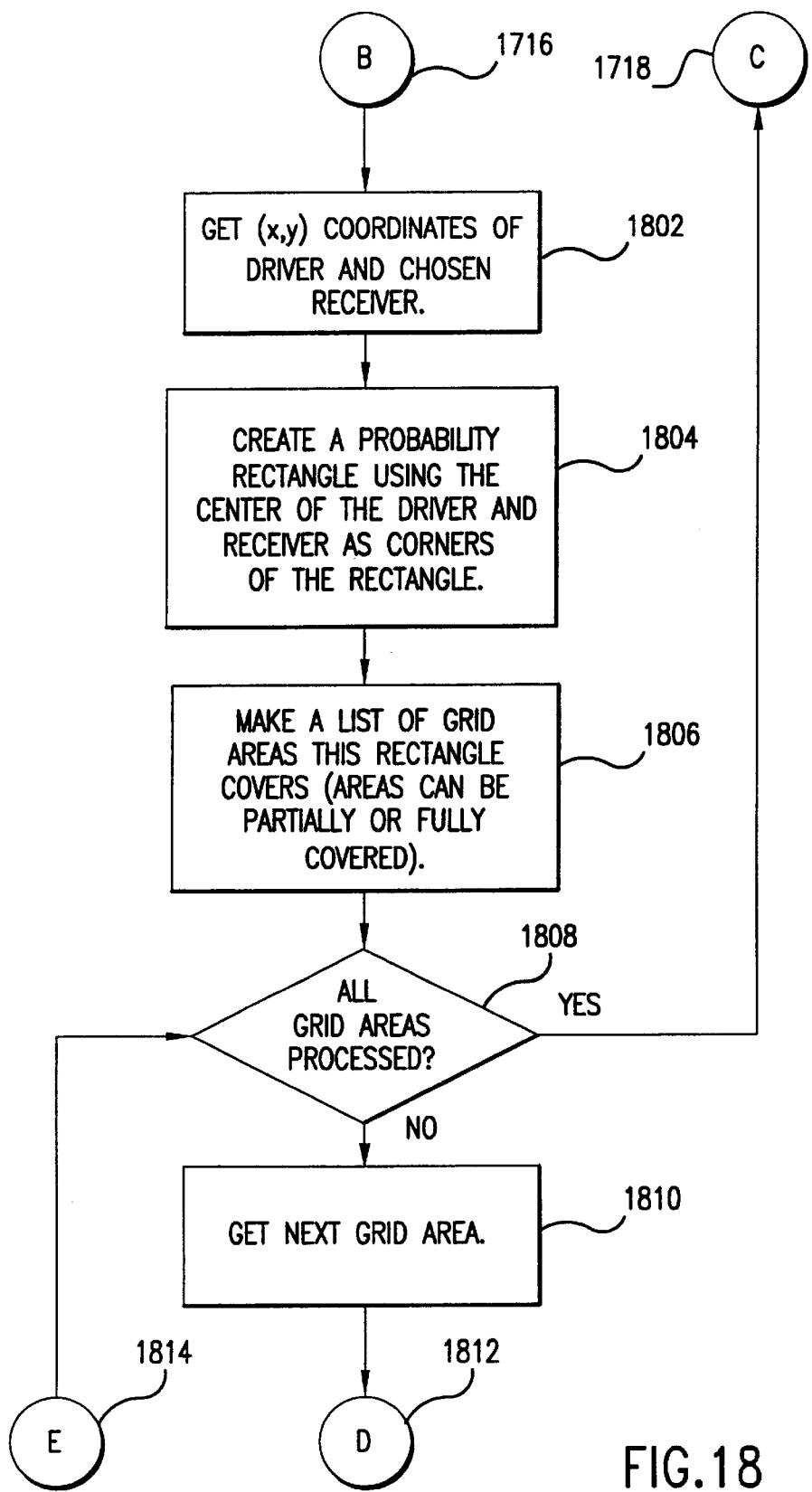
FIG. 18 is a continuation of the software flowchart from FIG. 17.
Figure 19:
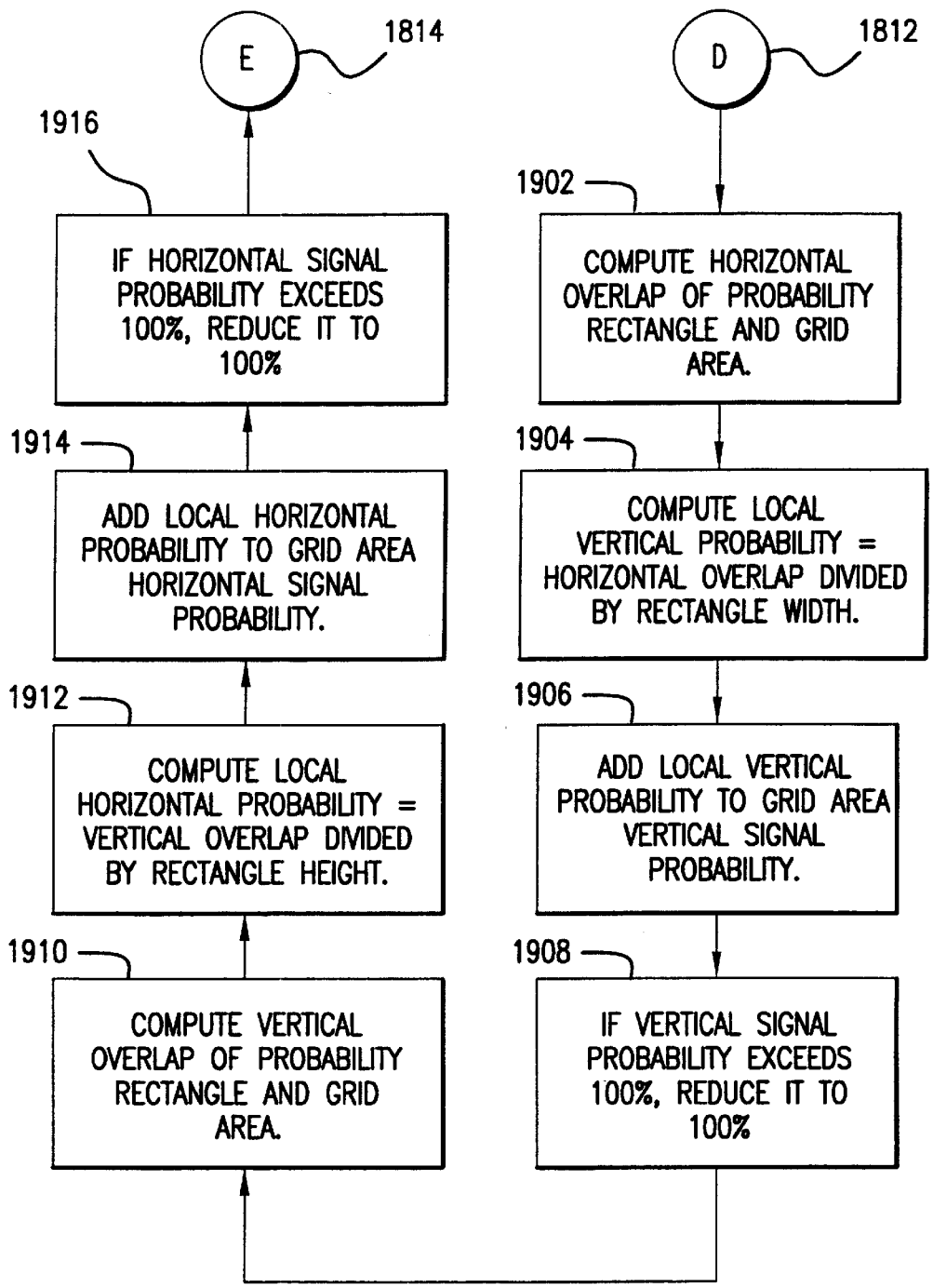
FIG. 19 is a continuation of the software flowchart from FIG. 18.

In FIG. 18 in a step 1802 the program retrieves the (x,y) coordinates of the driver and current receiver for the signal. In a step 1804 a probability rectangle is created using the center of the driver and receiver blocks as the corners of the rectangle. A list of grid areas that this probability rectangle covers is generated in step 1806. This list includes grid areas that are partially or fully covered by the probability rectangle. At the decision step 1808, the program checks to see if there are any grid areas remaining to be processed. If all the grid areas for the given probability rectangle have been processed, the program branches to step 1710 in FIG. 17 through the connector element C 1718. If there are grid areas yet to be processed, the program moves on to step 1810 where the next grid area is retrieved.

In a step 1902 (FIG. 19), through the connector element D 1812, the program computes the horizontal overlap of the probability rectangle and grid area. This horizontal overlap is illustrated in FIG. 7. In a step 1904, the local vertical probability is calculated by dividing the horizontal overlap by the rectangle width. This calculation is shown in FIG. 7. In a step 1906, the local vertical probability is added to the total vertical signal probability for the given grid area. In a step 1908, the vertical signal probability is set to 100% if it was greater than 100% after step 1906. In a step 1910, the program computes the vertical overlap of the probability rectangle and grid area. This vertical overlap is shown in FIG. 6. In a step 1912, the local horizontal probability is calculated by dividing the vertical overlap by the rectangle height. This calculation is shown in FIG. 6. In a step 1914, the local horizontal probability is added to the total horizontal signal probability for the given grid area. In a step 1916, the horizontal signal probability is set to 100% if it was greater than 100% after step 1914. The program then branches to decision step 1808 in FIG. 18 through connector D 1814.

Once all the signals in the design have been processed, as determined by the decision step 1702 in FIG. 17, the program starts routines 1714 in FIG. 17 to display the results as shown by the flowchart in FIG. 20. The display routines start at step 2002 and pass to step 2004 where the outline of the chip is drawn. In a step 2006, the outlines of all the blocks may be drawn. This step is optional. In a decision step 2008, if all the grid area have been displayed, the program branches to the end in step 2018. If there are grid areas to be displayed, the program continues to step 2010 where the coordinates and probability data for the next area are retrieved. The probabilities are then divided by the height or width of the grid area to get the densities, as shown in step 2012. For example, if the probability is 27 wires, and the height is 10 microns, the density is 2.7 wires/micron. In a step 2014, within the extent of the current grid area, a vertical bar is drawn to represent vertical density. This bar may be colored or shaded to represent density and may also have a numeric representation of the density printed inside or nearby. In a step 2016, within the extent of the current grid area, a horizontal bar is drawn to represent horizontal density. This bar may be colored or shaded to represent density and may also have a numeric representation of the density printed inside or nearby. The program returns to decision step 2008 and checks for more grid areas to display. The program then either displays another grid area with routing density estimates, or completes.

Once the final results have been displayed, the designer will be able to visually determine which areas of the design will be prone to routing congestion. This determination may be done by a purely subjective analysis of the data by the designer relying on past routing experience. Alternatively, it may be purely objective, by the designer setting a firm limit that the estimated routing densities should not exceed. Some embodiments of this invention may allow the designer to set a congestion threshold so that only routing densities above this threshold are displayed. The designer may then decide to make changes to the floor plan of the integrated circuit and run this process again to see any changes in the routing densities from the change in floor plan. This iterative process may continue until the designer is satisfied that he or she has found a useable floor plan for their design.

Many of the steps in this process are not order dependant. The loops may be constructed in other implementations needed to efficiently interface with an existing database. Many embodiments of this invention exist with the process steps occurring in orders differing from that shown in FIG. 17 through FIG. 20. In another embodiment of the invention, grid area densities may be calculated earlier in the process. For example, when the probability numbers are calculated, the grid area densities may be updated at that time. Another embodiment may build a complete set of probability rectangles before updating the grid areas. Another embodiment is to build a complete set of driver-receiver pairs before making any probability rectangles. Still other embodiments may place the probability rectangle corners at the closest corners of the blocks or at the farthest corners of the blocks. As implemented, this invention assumes only manhattan geometry (right angle) routing. A different embodiment may assume any-angle routing and change the output display to something other than horizontal and vertical densities. Also, bi-directional busses are ignored by the current embodiment. They may be added to the program in a number of different ways, such as randomly choosing a block to act as the 'driver' and treating the remainder of the blocks all as 'receivers'. Alternatively, the block closest to the center may be selected as the 'driver', or another selection criteria may be used.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method for estimating wiring congestion in integrated circuit designs, comprising the steps of:

obtaining estimated dimensions of an integrated circuit design, said integrated circuit design having an area;

partitioning said design area into a plurality of grid area s; and estimating a routing density for at least one grid area by adding a local probability to a total probability.

2. A method for estimating and displaying wiring congestion in integrated circuit designs, as recited in claim 1 further comprising:

displaying said routing density for at least one grid area.

3. A method as recited in claim 1 wherein the method step for estimating a routing density comprises:

making a list of signals in said integrated circuit design;

calculating an estimated vertical routing density for said signals in at least one grid area by adding a vertical local probability to a vertical total probability; and calculating an estimated horizontal routing density for said signals in at least one grid area by adding a horizontal local probability to a horizontal total probability.

4. A method for estimating and displaying wiring congestion in integrated circuit designs, as recited in claim 3 further comprising:

displaying said routing density for at least one grid area.

5. A method for estimating wiring congestion in integrated circuit designs, comprising the steps of:

obtaining estimated dimensions of an integrated circuit design, said integrated circuit design having an area;

partitioning said design area into a plurality of grid areas; and estimating a routing density for at least one grid area;

wherein the method step for estimating a routing density comprises:

making a list of signals in said integrated circuit design; and when at least one of said signals remains to be processed:

obtaining a signal from said signal list;

obtaining a set of (x,y) coordinates for each driver of said signal and each receiver of said signal;

creating a set of probability rectangles from said set of (x,y) coordinates for each driver and receiver of said signal;

making a list of said grid areas that said set of probability rectangles cover; and when at least one of said grid areas remains to be processed:

getting a current grid area from said grid area list;

calculating a local vertical probability from said set of probability rectangles for said current grid area;

calculating a local horizontal probability from said set of probability rectangles for said current grid area;

adding said local vertical probability to a vertical probability of said current grid area; and adding said local horizontal probability to a horizontal probability of said current grid area.

6. A method for estimating and displaying wiring congestion in integrated circuit designs, as recited in claim 5 further comprising:
   displaying said routing density for at least one grid area.

7. A method for estimating wiring congestion in integrated circuit designs, comprising the steps of:
   obtaining estimated dimensions of an integrated circuit design, said integrated circuit design having an area;
   partitioning said design area into a plurality of grid areas; and
   estimating a routing density for at least one grid area;
   wherein the method step for estimating a routing density comprises:
      making a list of signals in said integrated circuit design; and
      when at least one of said signals remains to be processed:
         getting a signal from said signal list;
         getting a driver and a list of receivers from said signal list; and
         when at least one of said receivers remains to be processed:
            getting a set of (x,y) coordinates for said drive r and a set of (x,y) coordinates for a current receiver;
            creating a probability rectangle from said set of (x,y) coordinates for said driver and said set of (x,y) coordinates for said current receiver;
            making a list of said grid areas that said probability rectangle covers; and
            when at least one of said grid areas remains to be processed:
               getting a grid area from said grid area list;
               calculating a horizontal overlap of said probability rectangle and said grid area;
               calculating a local vertical probability by dividing said horizontal overlap by width of said probability rectangle;
               adding said local vertical probability to a total vertical probability of said grid area;
               calculating a vertical overlap of said probability rectangle and said grid area;
               calculating a local horizontal probability by dividing said vertical overlap by height of said probability rectangle; and
               adding said local horizontal probability to a total horizontal probability of said grid area.

8. A method for estimating and displaying wiring congestion in integrated circuit designs, as recited in claim 7 further comprising:
   displaying said routing density for at least one grid area.

9. A method for estimating and displaying wiring congestion in integrated circuit designs, comprising the steps of:
   drawing an estimated outline of an integrated circuit design;
   partitioning said outline into a plurality of grid areas; and
   when at least one of said grid areas remains to be displayed:
      obtaining a set of(x,y) coordinates and estimated routing probabilities of a grid area;
      estimating vertical routing densities of said grid area by adding a local vertical probability to a total vertical probability;
      estimating horizontal routing densities of said grid area by adding a local horizontal probability to a total horizontal probability;
      displaying a vertical bar to represent said estimated vertical routing density within said grid area; and
      displaying a horizontal bar to represent said estimated horizontal routing density within said grid area.

10. The method as recited in claim 9, further comprising the step of:
    displaying an outline of blocks in said integrated circuit design.

11. A computer program storage medium readable by a computer, tangibly embodying a computer program of instructions executable by the computer to perform method steps for creating, and storing in memory estimated routing densities of an integrated circuit design, comprising the steps of
    obtaining estimated dimensions of an integrated circuit design, said integrated circuit design having an area;
    partitioning said integrated circuit design area into a plurality of grid areas; and
    estimating a routing density for at least one grid area by adding a local probability to a total probability.

12. A computer program storage medium readable by a computer, tangibly embodying a computer program of instructions executable by the compute perform method steps for creating, storing in memory, and displaying estimated routing densities of an integrated circuit design, as recited in claim 11, further comprising:
    displaying a routing density for at least one grid area.

13. The computer program storage medium as recited in claim 11 wherein the step for estimating a routing density further comprises:
    making a list of signals in said integrated circuit design;
    calculating an estimated vertical routing density for said signals in at least one grid area by adding a vertical local probability to a vertical total probability; and
    calculating an estimated horizontal routing density for said signals in at least one grid area by adding a horizontal local probability to a horizontal total probability.

14. A computer program storage medium readable by a computer, tangibly embodying a computer program of instructions executable by the computer to perform method steps for creating, storing in memory, and displaying estimated routing densities of an integrated circuit design, as recited in claim 13, further comprising:
    displaying a routing density for at least one grid area.

15. The computer program storage medium readable by a computer, tangibly embodying a computer program of instructions executable by the computer to perform method steps for creating, and storing in memory estimated routing densities of an integrated circuit design, comprising the steps of:
    obtaining estimated dimensions of an integrated circuit design, said integrated circuit design having an area;
    partitioning said integrated circuit design area into a plurality of grid areas; and
    estimating a routing density for at least one grid area,
    wherein the step for estimating a routing density further comprises:
       making a list of signals in said integrated circuit design; and
       for each signal in said signal list:
          obtaining a signal from said signal list;
          obtaining a set of(x,y) coordinates for each driver of said signal and each receiver of said signal;
          creating a set of probability rectangles from set of (x,y) coordinates for each driver and receiver of said signal;

making a list of said grid areas that said set of
probability rectangles cover; and
for each grid area in said grid area list:
obtaining a current grid area from said grid area list;
calculating a local vertical probability from said set of probability rectangles for said current grid area;
calculating a local horizontal probability from said set of probability rectangles for said current grid area;
adding said local vertical probability to a total vertical probability of said current grid area; and
adding said local horizontal probability to a total horizontal probability of said current grid area.

16. A computer program storage medium readable by a computer, tangibly embodying a computer program of instructions executable by the computer to perform method steps for creating, storing in memory, and displaying estimated routing densities of an integrated circuit design, as recited in claim 15, further comprising:
displaying a routing density for at least one grid area.

17. The computer program storage medium readable by a computer, tangibly embodying a computer program of instructions executable by the computer to perform method steps for creating, and storing in memory estimated routing densities of an integrated circuit design, comprising the steps of:
obtaining estimated dimensions of an integrated circuit design, said integrated circuit design having an area;
partitioning said integrated circuit design area into a plurality of grid areas; and
estimating a routing density for at least one grid area;
wherein the step for estimating a routing density further comprises:
making a list of signals in said integrated circuit design; and
for each signal in said signal list:
obtaining a signal from said signal list;
obtaining a current driver and list of receivers from said signal list; and
for each receiver in said receiver list:
obtaining a set of(x,y) coordinates for said driver and a current receiver;
creating a probability rectangle from said driver to said current receiver;
making a list of grid areas covered by said probability rectangle; and
for each grid area in said grid area list:
obtaining a current grid area from said grid area list;
calculating a horizontal overlap of said probability rectangle and said current grid area;
calculating a local vertical probability by dividing said horizontal overlap by width of said probability rectangle;
adding said local vertical probability to a vertical probability of said current grid area;
calculating a vertical overlap of said probability rectangle and said current grid area;
calculating a local horizontal probability by dividing said vertical overlap by height of said probability rectangle; and
adding said local horizontal probability to a horizontal probability of said current grid area.

18. A computer program storage medium readable by a computer, tangibly embodying a computer program of instructions executable by the computer to perform method steps for creating, storing in memory, and displaying estimated routing densities of an integrated circuit design, as recited in claim 17, further comprising:
displaying a routing density for at least one grid area.

19. A computer program storage medium readable by a computer, tangibly embodying a computer program of instructions executable by the computer to perform method steps for creating, and storing in memory estimated routing densities of an integrated circuit design, comprising the steps of:
obtaining a set of estimated dimensions of an integrated circuit design;
said integrated circuit design having an area;
partitioning said integrated circuit design area into a plurality of grid areas;
making a list of signals in the integrated circuit design;
for each signal in said signal list:
obtaining a signal from said signal list;
obtaining a current driver and a list of receivers from said signal list; and
for each receiver in said receiver list:
obtaining a set of (x,y) coordinates of said driver and a current receiver;
creating a probability rectangle from said driver to said current receiver;
making a list of grid areas covered by said probability rectangle; and
for each grid area in said grid area list:
obtaining a current grid area from said grid area list;
calculating a horizontal overlap of said probability rectangle and said current grid area;
calculating a local vertical probability by dividing said horizontal overlap by width of said probability rectangle;
adding said local vertical probability to a vertical probability of said current grid area;
calculating a vertical overlap of said probability rectangle and said current grid area;
calculating a local horizontal probability by dividing said vertical overlap by height of said probability rectangle; and
adding said local horizontal probability to a horizontal probability of said current grid area; and
for each grid area:
obtaining a set of coordinates and routing probabilities of a current grid area; and
calculating a vertical routing density and a horizontal routing density of said current grid area.

20. A computer program storage medium readable by a computer, tangibly embodying a computer program of instructions executable by the computer to perform method steps for creating, storing in memory, and displaying estimated routing densities of an integrated circuit design, as recited in claim 19, further comprising:
drawing an outline of said integrated circuit design; and
for each grid area:
obtaining a current grid area; and
displaying said vertical routing density and said horizontal routing density of said current grid area.

21. The computer program storage medium as recited in claim 20 wherein the step for displaying said vertical routing density and said horizontal routing density of said current grid area further comprises:
drawing a vertical bar to represent said estimated vertical routing density within said grid area; and drawing a horizontal bar to represent said estimated horizontal routing density within said grid area.

22. A computer implemented method within an operating system process comprising the steps of:
  obtaining estimated dimensions of an integrated circuit design, said integrated circuit design having an area;
  partitioning said integrated circuit design area into a plurality of grid areas; and
  estimating a routing density for at least one grid area by adding a local probability to a total probability.

23. The computer implemented method as recited in claim 22, further comprising:
  displaying a routing density for at least one grid area.

24. The computer implemented method as recited in claim 22 wherein the method step for estimating a routing density further comprises:
  making a list of signals in said integrated circuit design;
  calculating an estimated vertical routing density for said signals in at least one grid area by adding a vertical local probability to a vertical total probability; and
  calculating an estimated horizontal routing density for said signals in at least one grid area by adding a horizontal local probability to a horizontal total probability.

25. The computer implemented method as recited in claim 24, further comprising:
  displaying a routing density for at least one grid area.

26. The computer implemented method within an operating system process comprising the steps of:
  obtaining estimated dimensions of an integrated circuit design, said integrated circuit design having an area;
  partitioning said integrated circuit design area into a plurality of grid areas; and
  estimating a routing density for at least one grid area;
  wherein the method step for estimating a routing density further comprises:
    making a list of signals in said integrated circuit design; and
    for each signal in said signal list:
      obtaining a signal from said signal list;
      obtaining a set of (x,y) coordinates for each driver of said signal and each receiver of said signal;
      creating a set of probability rectangles from set of(x,y) coordinates for each driver and receiver of said signal;
      making a list of said grid areas that said set of probability rectangles cover; and
      for each grid area in said grid area list:
        obtaining a current grid area from said grid area list;
        calculating a local vertical probability from said set of probability rectangles for said current grid area;
        calculating a local horizontal probability from said set of probability rectangles for said current grid area;
        adding said local vertical probability to a total vertical probability of said current grid area; and
        adding said local horizontal probability to a total horizontal probability of said current grid area.

27. The computer implemented method as recited in claim 26, further comprising:
  displaying a routing density for at least one grid area.

28. The computer implemented method within an operating system process comprising the steps of:
  obtaining estimated dimensions of an integrated circuit design, said integrated circuit design having an area;
  partitioning said integrated circuit design area into a plurality of grid areas; and
  estimating a routing density for at least one grid area;
  wherein the method step for estimating a routing density further comprises:
    making a list of signals in said integrated circuit design; and
    for each signal in said signal list:
      obtaining a signal from said signal list;
      obtaining a current driver and list of receivers from said signal list; and
      for each receiver in said receiver list:
        obtaining a set of (x,y) coordinates for said driver and a current receiver;
        creating a probability rectangle from said driver to said current receiver;
        making a list of grid areas covered by said probability rectangle; and
        for each grid area in said grid area list:
          obtaining a current grid area from said grid area list;
          calculating a horizontal overlap of said probability rectangle and said current grid area;
          calculating a local vertical probability by dividing said horizontal overlap by width of said probability rectangle;
          adding said local vertical probability to a vertical probability of said current grid area;
          calculating a vertical overlap of said probability rectangle and said current grid area;
          calculating a local horizontal probability by dividing said vertical overlap by height of said probability rectangle; and
          adding said local horizontal probability to a horizontal probability of said current grid area.

29. The computer implemented method as recited in claim 28, further comprising:
  displaying a routing density for at least one grid area.

30. A computer implemented method within an operating system process comprising the steps of:
  obtaining a set of estimated dimensions of an integrated circuit design;
  said integrated circuit design having an area;
  partitioning said integrated circuit design area into a plurality of grid areas;
  making a list of signals in the integrated circuit design;
  for each signal in said signal list:
    obtaining a signal from said signal list;
    obtaining a current driver and a list of receivers from said signal list; and
    for each receiver in said receiver list:
      obtaining a set of (x,y) coordinates of said driver and a current receiver;
      creating a probability rectangle from said driver to said current receiver;
      making a list of grid areas covered by said probability rectangle; and
      for each grid area in said grid area list:
        obtaining a current grid area from said grid area list;
        calculating a horizontal overlap of said probability rectangle and said current grid area;
        calculating a local vertical probability by dividing said horizontal overlap by width of said probability rectangle;

adding said local vertical probability to a vertical probability of said current grid area;

calculating a vertical overlap of said probability rectangle and said current grid area;

calculating a local horizontal probability by dividing said vertical overlap by height of said probability rectangle; and adding said local horizontal probability to a horizontal probability of said current grid area; and for each grid area:

obtaining a set of coordinates and routing probabilities of a current grid area; and calculating a vertical routing density and a horizontal routing density of said current grid area.

31. The computer implemented method as recited in claim 30, further comprising:

drawing and outline of said integrated circuit design; and for each grid area:

obtaining a current grid area; and displaying said vertical routing density and said horizontal routing density of said current grid area.

32. The computer implemented method as recited in claim 31 wherein the method step for displaying said vertical routing density and said horizontal routing density of said current grid area further comprises:

drawing a vertical bar to represent said estimated vertical routing density within said grid area; and drawing a horizontal bar to represent said estimated horizontal routing density within said grid area.

* * * * *